United States Patent [19]

Hashimoto et al.

[11] Patent Number: 5,538,816
[45] Date of Patent: Jul. 23, 1996

[54] HALFTONE PHASE SHIFT PHOTOMASK, HALFTONE PHASE SHIFT PHOTOMASK BLANK, AND METHODS OF PRODUCING THE SAME

[75] Inventors: Keiji Hashimoto; Junji Fujikawa; Hiroshi Mohri; Masahiro Takahashi; Hiroyuki Miyashita; Yukio Iimura, all of Tokyo, Japan

[73] Assignees: Dai Nippon Printing Co., Ltd.; Mitsubishi Electric Corporation, both of Tokyo, Japan

[21] Appl. No.: 225,905

[22] Filed: Apr. 11, 1994

[30] Foreign Application Priority Data

| Apr. 9, 1993 | [JP] | Japan | 5-083433 |
| Apr. 9, 1993 | [JP] | Japan | 5-083434 |
| Jul. 13, 1993 | [JP] | Japan | 5-173042 |

[51] Int. Cl.$^6$ .................................................. G03F 9/00
[52] U.S. Cl. ............................. 430/5; 430/322; 427/582; 428/203; 428/472; 428/696; 428/698
[58] Field of Search .................. 430/5, 322; 428/203, 428/472, 696, 698; 427/582

[56] References Cited

U.S. PATENT DOCUMENTS

| 5,230,971 | 7/1993 | Alpay | 430/5 |
| 5,286,581 | 2/1994 | Lee | 430/5 |

Primary Examiner—S. Rosasco
Attorney, Agent, or Firm—Sughrue, Mion, Zinn, Macpeak & Seas

[57] ABSTRACT

A halftone phase shift photomask designed so that it is possible to shorten the photoengraving process, use a production line for a conventional photomask, prevent lowering of the contract between the transparent and semitransparent regions at a long wavelength in the visible region, which is used for inspection and measurement, and also prevent charge-up during electron beam exposure, and that ordinary physical cleaning process can be used for the halftone phase shift photomask. The halftone phase shift photomask has on a transparent substrate (1) a region which is semitransparent to exposure light and a region which is transparent to the exposure light so that the phase difference between light passing through the transparent region and light passing through the semitransparent region is substantially $\pi$ radians. A semitransparent film that constitutes the semitransparent region is arranged in the form of a multilayer film including layers (3, 4) of chromium or a chromium compound. For example, the layer (3) is formed of chromium oxide, chromium oxide nitride, chromium oxide carbide, or chromium oxide nitride carbide, and the layer (4) is formed of chromium or chromium nitride. The layer (3) mainly serves as a phase shift layer, while the layer (4) mainly serves as a transmittance control layer that suppresses the rise of transmittance at the long wavelength side. The semitransparent film is formed by physical vapor deposition.

42 Claims, 14 Drawing Sheets

HALFTONE PHASE SHIFT PHOTOMASK, HALFTONE PHASE SHIFT PHOTOMASK BLANK, AND METHODS OF PRODUCING THE SAME

BACKGROUND OF THE INVENTION

The present invention relates to photomasks used for producing integrated circuits of high integration density, e.g., large-scale integrated circuits (LSI), very large-scale integrated circuits (VLSI), etc., and to photomask blanks used to produce such photomasks. More particularly, the present invention relates to a halftone phase shift photomask whereby a projected image of very small size can be obtained, and also to a halftone phase shift photomask blank for producing the halftone phase shift photomask. Further, the present invention relates to methods of producing the halftone phase shift photomask and the halftone phase shift photomask blank.

Semiconductor integrated circuits, e.g., IC, LSI, VLSI, etc., are produced by repeating thin film forming processes, e.g., oxidation, CVD or sputtering, a photolithography process and a diffusion process, e.g., ion implantation. In the photolithography process, a resist is coated on a substrate to be processed, e.g., a silicon wafer, and this resist is subjected to exposure by a reduction projection stepper or other exposure systems using a photomask to form a desired pattern thereon, followed by development and etching.

With the achievement of high-operating speed and high integration of semiconductor integrated circuits, the minimum size of photoresist patterns formed by the above-described photolithography process has increasingly been demanded to become smaller. Accordingly, the demanded device patterns cannot be realized by the conventional reduction projection stepper exposure method that employs an ordinary photomask because of the resist pattern resolution limit of this method. To overpass this limit, a phase shift photomask having a novel structure and a phase shift exposure method that uses the phase shift photomask have been proposed, as disclosed, for example, in Japanese Patent Application Laid-Open (KOKAI) No. 58-173744 (1983) and Japanese Patent Application Post-Exam Publication No. 62 -59296 (1987). The phase shift exposure method is a technique whereby the resolution and the depth of focus are improved by controlling the phase of exposure light passing through a phase shift pattern formed on a photomask.

Phase shift photomasks having various arrangements have been proposed. Among them, what is called halftone phase shift photomask such as those disclosed in U.S. Pat. No. 4,890,309 and Japanese Patent Application Laid-Open (KOKAI) No. 4-136854 (1992) has attracted attention from the expectation that it will soon be put to practical use, and some proposals have been made with regard to arrangements and materials of the halftone phase shift photomask, which enable an improvement in yield and a reduction in cost as a result of a reduction in the number of manufacturing steps required. For example, see Japanese Patent Application Laid-Open (KOKAI) Nos. 5-2259 (1993) and 5-127361 (1993).

The halftone phase shift photomask will briefly be explained below with reference to the accompanying drawings. FIG. 3 shows the principle of the halftone phase shift lithography, and FIG. 4 shows a conventional lithography method. FIGS. 3(a) and 4(a) are sectional views showing photomasks. FIGS. 3(b) and 4(b) each show the amplitude of light on the photomask. FIGS. 3(c) and 4(c) each show the amplitude of light on a wafer. FIGS. 3(d) and 4(d) each show the light intensity on the wafer. Reference numerals 101 and 201 denote substrates, and 202 a 100% light-shielding film. A semitransparent film 102 shifts the phase of incident light through substantially 180° and has a transmittance of 1% to 50%. Reference numerals 103 and 203 denote incident light. In the conventional method, as shown in FIG. 4(a), the 100% light-shielding film 202, which is made of chromium, for example, is formed on the substrate 201, which is made of quartz (fused silica), for example, and the light-shielding film 202 is merely formed with a light-transmitting portion in a desired pattern. Accordingly, the light intensity distribution on the wafer has a gentle slope, as shown in FIG. 4(d). As a result, the resolution is degraded. In the halftone phase shift lithography, on the other hand, the light passing through the semitransparent film 102 and the light passing through the opening in the film 102 are in substantially inverse relation to each other in terms of phase. Accordingly, the light intensity at the pattern boundary portion on the wafer is 0, as shown in FIG. 3(d). Thus, it is possible to prevent the light intensity distribution from exhibiting a gentle slope. Accordingly, the resolution can be improved.

The halftone phase shift photomask has on a transparent substrate at least a region which is semitransparent to exposure light and a region which is transparent to the exposure light so that the phase difference between the light passing through the semitransparent region and the light passing through the transparent region is substantially π radians. With the halftone phase shift photomask, the resolution improves and the depth of focus enlarges at holes, dots, spaces, lines, etc. on semiconductor devices. The halftone phase shift photomask is most effective when the following relation is satisfied:

$$d=\lambda/\{2(n-1)\}$$

where d is the thickness of the semitransparent film, λ is the wavelength of exposure light, and n is the refractive index of the semitransparent film for the wavelength of exposure light.

It should be noted here that a phase shift photomask of a type other than halftone phase shift photomask requires at least two photoengraving processes to produce a mask pattern because the light-shielding film and the phase shifter film have different patterns, whereas the halftone phase shift photomask essentially requires only one photoengraving process because it has only one pattern; this is a great advantage of the halftone phase shift photomask.

Incidentally, the semitransparent film 102 of the halftone phase shift photomask is demanded to perform two functions, that is, phase inversion and transmittance control. To realize these two functions, the semitransparent film 102 may be arranged either in the form of a single-layer film wherein a single layer takes charge of both functions or in the form of a multilayer film wherein the two functions are assigned to respective layers. In the former case, the photoengraving process is required only once. Therefore, it is possible to make use of the advantage of the halftone phase shift photomask. In the latter case, however, two photoengraving processes must be carried out because the materials of constituent layers are different even in a case where the identical pattern is formed, as will be clear by taking a look at an arrangement in which a phase shifter layer of spin-on-glass (SOG) is used as a layer that effects phase inversion, and a chromium light-shielding layer is used as a layer that performs transmittance control. Therefore, the multilayer film arrangement results in a rise in cost and a reduction in yield. Accordingly, it has heretofore been necessary to form the semitransparent film 102 in a single-layer structure. Even when it adopts a multilayer structure, it is necessary to find a combination of a phase shifter layer material and a light-shielding layer material which enables the semitransparent film 102 to be formed by a single photoengraving process.

However, there is known no semitransparent film material that satisfies the above-described requirements and that can be used without any substantial problems from the viewpoint of the photomask producing process. Thus, it is extremely difficult to select a semitransparent film material. A film which is composed mainly of a chromium compound, proposed in Japanese Patent Application Laid-Open (KOKAI) No. 5-127361 (1993), is the only example that may satisfy the above-described requirements. However, chromium compounds largely vary in optical characteristics according to the chemical composition thereof. Therefore, in many cases, chromium compounds cannot practically be used as a semitransparent film for a halftone phase shift photomask.

In view of the above-described circumstances, it is a first object of the present invention to provide a halftone phase shift photomask which has a simple structure and enables the photoengraving process to be shortened, thereby making it possible to attain a reduction in cost and an improvement in yield, and which also enables the greater part of a production line for a conventional chromium photomask to be used as it is, and also provide a halftone phase shift photomask blank for producing the halftone phase shift photomask.

In the meantime, a halftone phase shift photomask structure such as that shown in FIG. 17 has been proposed. In the figure, reference numeral 501 denotes a quartz substrate, and 502 a chromium thin film. The chromium thin film 502 forms a semitransparent region, and a region where no chromium thin film 502 is present defines a transparent region. The mask with such a structure has the problem that it is difficult to repair a defect, although the mask can be processed, inspected and cleaned in a similar manner to the conventional process.

As a structure wherein a defect can be repaired in the conventional repairing process, a single-layer film of a metal oxide may be considered. FIG. 18 shows the transmittance spectrum in the wavelength range of 200 nm to 800 nm of chromium oxide as one example of metal oxides. The thickness d of this film has been adjusted so as to satisfy $d=\lambda/\{2(n-1)\}$ for the exposure wavelength of the i-line (365 nm) of a super-high pressure mercury lamp. As will be clear from FIG. 18, the transmittance for this exposure wavelength is sufficiently low, but the transmittance for long wavelengths in the visible region, which are used for inspection, measurement, etc., is high.

Thus, in a phase shifter comprising a single layer of a metal oxide, it is possible to control the transmittance for the exposure wavelength, but the transmittance undesirably rises at the long wavelength side. Wavelengths at the long wavelength side, particularly the e-line (546 nm) of a super-high pressure mercury lamp, are used for inspection of photomasks and size measurement thereof. However, in the inspection of a mask having a single-layer phase shifter of a metal oxide, if the transmittance for the e-line exceeds 30%, inspection and size measurement cannot be performed because of a reduction in contrast between the transparent and semitransparent regions.

Further, since such a metal oxide has no electric conductivity, charge-up occurs during electron beam exposure, causing displacement of the resist pattern.

In addition, the transmittance of halftone phase shift photomasks varies according to exposure conditions and device manufacturers. Therefore, various levels of transmittance are demanded. It is difficult to control the refractive index and the extinction coefficient so that only the transmittance varies according to film forming conditions without changing the phase difference.

In view of the above-described problems of the background art, it is a second object of the present invention to provide a halftone phase shift photomask which is designed so that:

① the rise in the transmittance for a long wavelength in the visible region, which is used for inspection, measurement, etc., is suppressed to prevent reduction in contrast between the transparent and semitransparent regions, thereby facilitating inspection and measurement;

② electric conductivity is imparted to the phase shifter film to thereby prevent occurrence of charge-up;

③ the control of transmittance can be facilitated with the exposure wavelength phase difference held at 180°;

④ the reflectivities of the obverse and reverse surfaces can be controlled; and

⑤ an optimal multilayer structure can be realized for each of at least two different kinds of exposure light by controlling the thickness of each layer with the film composition of each layer maintained as it is.

FIG. 23 is a sectional view showing one example of a halftone phase shift photomask disclosed in Japanese Patent Application Laid-Open (KOKAI) No. 4-136854 (1992) as a conventional example of the halftone phase shift photomask relating to the present invention. The conventional photomask includes a glass substrate 411 and a patterned semitransparent film 412 provided thereon. The semitransparent film 412 is made of a spin-on-glass (SOG) having a light-absorbing material added thereto.

However, SOG generally has a low bond strength with respect to the substrate in comparison to a film that is formed by physical vapor deposition (PVD), e.g., sputtering, which is used for ordinary photomasks. Accordingly, the film may be separated or cracked during a physical cleaning process which is commonly carried out in ordinary photomask processing by using a brush scrubber, a high-pressure jet spray, an ultrasonic cleaner, etc. Therefore, it is difficult to clean the film satisfactorily.

Further, the refractive index of SOG for the exposure wavelength of 365 nm (i-line) is generally low, i.e., of the order of 1.4 to 1.5, and it is necessary in order to effect a 180° phase shift to provide SOG to a thickness of about 365 nm to 456 nm, which is larger than the thickness of light-shielding films, composed mainly of chromium or molybdenum, of ordinary photomasks, i.e., about 60 nm to 130 nm. Accordingly, SOG cannot be etched with sufficiently high accuracy, and it is difficult to obtain vertical side-walls by etching.

In view of the above-described problems of the background art, it is a third object of the present invention to provide a halftone phase shift photomask for which a physical cleaning process used for cleaning ordinary photomasks can be used as it is and which has vertical side-walls processed with high accuracy, and also provide a halftone phase shift photomask blank for producing the halftone phase shift photomask.

SUMMARY OF THE INVENTION

As has been described above, the first object of the present invention is to provide a halftone phase shift photomask which has a simple structure and enables the photoengraving process to be shortened, thereby making it possible to attain a reduction in cost and an improvement in yield, and which also enables the greater part of a production line for a conventional chromium photomask to be used as it is, and also provide a halftone phase shift photomask blank for producing the halftone phase shift photomask.

The second object of the present invention is to provide a halftone phase shift photomask which is designed so that:

① the rise in the transmittance for a long wavelength in the visible region, which is used for inspection, measurement, etc., is suppressed to prevent reduction in contrast between the transparent and semitransparent regions, thereby facilitating inspection and measurement;

② electric conductivity is imparted to the phase shifter film to thereby prevent occurrence of charge-up;

③ the control of transmittance is facilitated with the exposure wavelength phase difference held at 180°;

④ the reflectivities of the obverse and reverse surfaces can be controlled; and

⑤ an optimal multilayer structure can be realized for each of at least two different kinds of exposure light by controlling the thickness of each layer with the film composition of each layer maintained as it is.

The third object of the present invention is to provide a halftone phase shift photomask for which a physical cleaning process used for cleaning ordinary photomasks can be used as it is and which has vertical sections processed with high accuracy, and also provide a halftone phase shift photomask blank for producing the halftone phase shift photomask.

In view of the above-described problems of the background art, we conducted studies in order to develop a halftone phase shift photomask which is practical, highly accurate and easy to produce. As a result, we have found that a semitransparent film of a halftone phase shift photomask, which performs both phase inversion and transmittance control, can be arranged in the form of a single-layer film or a multilayer film which can be patterned by a single photoengraving process by adopting a structure including a film composed mainly of a chromium compound which falls within a certain composition range. The halftone phase shift photomask and halftone phase shift photomask blank according to the first aspect of the present invention have been accomplished on the basis of this finding.

That is, according to the first aspect of the present invention, there is provided a halftone phase shift photomask blank comprising a transparent substrate, and a single-layer film provided on the transparent substrate and composed mainly of a chromium compound which falls within a limited composition range, or a multilayer film including the chromium compound film. In addition, there is provided a halftone phase shift photomask obtained by patterning the semitransparent film of the above-described blank.

The semitransparent film of a halftone phase shift photomask is required to have characteristics for inverting the phase of exposure light and characteristics for controlling the transmittance, as has already been described above. These characteristics are determined by the complex index of refraction (refractive index and extinction coefficient) of a substance constituting the semitransparent film (substances constituting respective layers, in the case of a multilayer film) and the film thickness. If the semitransparent film is treated as an absorbing film which is shown in M. Born, E. Wolf "Principles of Optics", pp.628–632, for example, multiple interference can be neglected. Accordingly, the phase change $\phi$ of perpendicularly transmitted light may be calculated as follows:

$$\phi = \sum_{k=1}^{m-1} x^{k,k+1} + \sum_{k=2}^{m-1} 2(u_k - 1)d_k/\lambda \qquad (1)$$

where $\phi$ is the phase change occurring on light when perpendicularly transmitted through a photomask having a multilayer (m-2 layers) film formed on a substrate, $x^{k,k+1}$ is the phase change occurring at the interface between the k-th layer and the (k+1)th layer, $u_k$ and $d_k$ are the refractive index of a material constituting the k-th layer and the thickness of the k-th layer, respectively, and $\lambda$ is the wavelength of exposure light. It is assumed here that the layer of k=1 is the substrate, and the layer of k=m is air.

In general, halftone phase shift photomasks are required to have a transmittance of 1% to 50% for exposure light. If a semitransparent film formed on a transparent substrate to a thickness obtained by calculation of the above equation (1) shows a transmittance in the range of 1% to 50%, the semitransparent film can be used for a single-layer halftone phase shift photomask as it is. When the transmittance exceeds the upper limit of the above range (i.e., when the semitransparent film transmits an excessively large amount of exposure light), a light-shielding layer made of a metal chromium thin film or the like for controlling the transmittance is provided in addition to the semitransparent film in a stack structure, thereby enabling the transmittance to fall within the above range in the form of the multilayer halftone phase shift photomask described above.

One of the advantageous features of the film composed mainly of a chromium compound according to the first aspect of the present invention resides in that if a film composed mainly of metal chromium, for example, is used as the above-described light-shielding layer, the semitransparent film can be patterned by only one photoengraving process, as shown in Examples (described later), and it is therefore possible to reduce the number of manufacturing steps required and achieve a reduction in cost and an improvement in yield. It is a matter of course that transmittance control and phase inversion can also be effected by a semitransparent film formed by stacking two or more films composed mainly of chromium compounds having different compositions, respectively. In such a stack structure, the compositions of the layers do not necessarily need to change discontinuously at the interface between each pair of adjacent layers, but the arrangement may be such that there is substantially no interface and the composition changes continuously. In such a case, however, the amount of phase change slightly shifts from that in the simulation of the above equation (1). Further, each layer does not necessarily need to be formed of a material which is homogeneous in the direction of the thickness thereof, but there may be a distribution in the composition, structure, etc. When a semitransparent film is formed by stacking a plurality of films including a film composed mainly of a chromium compound and a film composed mainly of metal chromium, it is possible to control the transmittance spectrum distribution and improve etching processability by making the compositions, textural structures and film forming conditions of these films different from each other.

Examples of the chromium compound used in the halftone phase shift photomask according to the first aspect of the present invention include chromium oxide, chromium oxide carbide, chromium oxide nitride, chromium oxide carbide nitride, and these chromium compounds which contain argon. It has been found that films which are composed mainly of these compounds largely vary in optical characteristics according to the chemical composition thereof. We measured the refractive index and extinction coefficient of films formed with the composition varied and also the transmittance at the above film thickness adequate for phase inversion. As a result, we have found that there is a composition range within which a film composed mainly of a chromium compound can be effectively used as a semitransparent film of a single-layer or multilayer halftone phase shift photomask. Grounds for determining this composition range will be explained below more specifically.

The film composed mainly of a chromium compound is formed on a transparent substrate by a conventional thin-film forming method, e.g., vacuum deposition, sputtering, ion plating, etc. In the case of sputtering, for example, the film can be formed by reactive sputtering of a metal chromium target. In the process, a reactive gas, which can supply an element that will be taken into the film by a reaction taking place on the target surface or the substrate surface or in the sputter space to form a chromium compound, is mixed with a conventionally used sputter gas according to need, thereby forming a chromium compound on the substrate. It is a matter of course that both the reactive gas and the sputter gas may be in the form of a mixture of a plurality of gases. This method has a great advantage in that a sputtering system that is used to produce ordinary chromium photomask blanks can be used as it is. By changing the kinds of gas and the mixing ratio, chromium compounds having various compositions can be formed.

In this type of film forming method, it is conventional practice to use as a reactive gas one or a plurality of gases selected from among gases which can serve as an oxygen source gas, e.g., oxygen, carbon dioxide, carbon monoxide, water vapor, nitrogen oxide, nitrogen suboxide, etc., and one or a plurality of gases selected from among conventionally used sputter gases, e.g., argon, nitrogen, neon, helium, xenon, etc., according to need. FIG. 5 shows the results of an example in which carbon dioxide gas was used as an oxygen source, while nitrogen gas was used as a sputter gas, and films were formed on a satisfactorily cleaned silicon wafer with the carbon dioxide gas/nitrogen gas flow rate ratio varied. Then, the refractive index and extinction coefficient of each film were measured with a commercially available spectroellipsometer. Further, a film thickness required for shifting the phase of exposure light through 180° was calculated with regard to exposure carried out at the wavelength of the i-line (356 nm) of a super-high pressure mercury lamp, using a synthetic quartz substrate, and the transmittance of each film formed on the photomask substrate to the calculated thickness was measured. The film forming system used in the example was an ordinary planar DC magnetron sputtering system, and the film formation was carried out under the conditions that the gas pressure was 3.0 mTorr; the overall gas flow rate of the carbon dioxide gas and the nitrogen gas was 100 sccm; and the sputter current density was 0.01 A/cm$^2$. As will be clear from FIG. 5, films formed in a region where the proportion of the carbon dioxide gas flow rate is larger than several % can be favorably used as a semitransparent film for a halftone phase shift photomask from the viewpoint of the relation to the transmittance.

FIG. 6 shows the results of measurement of the relationship between the ratio of chromium atoms to oxygen, carbon and nitrogen atoms and the carbon dioxide gas/nitrogen gas flow rate ratio by the X-ray photoelectron spectroscopy (XPS) for the films formed on the silicon wafer with the carbon dioxide gas/nitrogen gas ratio varied as follows: 0/100, 10/90, 20/80, 70/30, and 100/0. The graph shows the numbers of oxygen, carbon and nitrogen atoms existing per 100 chromium atoms. The X-ray photoelectron spectroscopy was carried out under the conditions described later. As will be clear from FIG. 6, a point of inflection is clearly observed in the relationship between the carbon dioxide gas/nitrogen gas flow rate ratio and the film composition as shown by the point a in the graph. That is, in a region where the proportion of the carbon dioxide gas flow rate is smaller than the point a, the composition largely depends on the flow rate ratio. As the carbon dioxide gas flow rate is increased from 0 to 20%, the number of oxygen atoms per 100 chromium atoms rapidly changes from about 50 to more than 200, while the number of nitrogen atoms rapidly changes from more than 100 to less than 20. The oxygen and nitrogen atoms are in complementary relation to each other. Therefore, the total number of oxygen and nitrogen atoms is always of the order of 200 to 300 per 100 chromium atoms. On the other hand, the number of carbon atoms does not show a large change on the whole. By comparing FIGS. 5 and 6, the composition range of chromium, oxygen and nitrogen atoms will become clear.

Similar film formation was carried out in a carbon dioxide gas/argon gas system using argon, which is a common sputter gas. Consequently, results similar to those in the case of the carbon dioxide gas/nitrogen gas system were obtained. Thus, it has been revealed that with regard to chromium, oxygen and argon atoms also, the same composition range as the above is an effective range for forming a semitransparent film of a halftone phase shift photomask.

Next, to examine the role of carbon atoms, similar film formation was carried out in an oxygen gas/argon gas system using oxygen gas as an oxygen source in place of the carbon dioxide gas. At this time also, results similar to the above were obtained. However, the chemical resistance of the film was inferior to those formed in the carbon dioxide gas/nitrogen gas system and the carbon dioxide gas/argon gas system. FIG. 7 shows the reduction in thickness of the films after dipping for 30 minutes in a mixed acid of concentrated sulfuric acid and concentrated nitric acid in the volume ratio of 10:1, heated to 80° C., which is commonly used for cleaning photomasks. It will be understood from FIG. 7 that the film formed by using carbon dioxide gas is superior to the film formed by using oxygen gas in the resistance to the mixed acid used for cleaning. This nature similarly applies to other chemicals (acids, alkalis, organic solvents, etc.) used in the mask process.

It should be noted that the film formed in the oxygen gas/argon gas system, shown in FIG. 7, can be put to practical use, although it is inferior in the resistance to acids.

FIG. 8 shows the composition of the film formed in the oxygen gas/argon gas system, analyzed by the X-ray photoelectron spectroscopy. It will be understood by comparing FIGS. 8 and 6 that the two films are different from each other in the number of carbon atoms contained therein. Thus, it may be considered that the above-described chemical resistance is obtained by the presence of carbon atoms in the film. It should be noted that it is generally difficult to perform quantitative analysis of carbon atoms, and that the presence of carbon atoms in the film is confirmed in FIGS. 6 and 8 even when a gas that serves as a carbon source is not positively introduced. Therefore, it is considered that some background is superimposed on these results. Accordingly, the present inventors examined various film forming environments and analytical environments and, as a result, we have found out that the above-described effect is manifested when the number of carbon atoms contained in the film is not smaller than 2% of the number of chromium atoms. FIG. 9 shows the profile of the composition in the direction of the depth obtained by the X-ray photoelectron spectroscopy. In many cases, many carbon atoms are distributed in the surface region. A film that contains a relatively large number of carbon atoms in the surface region has improved resistance to chemicals used for dipping.

It may be considered from the above results that films composed mainly of a chromium compound which are usable as a semitransparent film of a halftone phase shift photomask are restricted to those which fall within the following composition ranges ① to ⑥. Although in the foregoing description the present invention has been explained by way of one example in which reactive sputtering using a chromium target is used as a production process, it should be noted that the described reactive sputtering is merely an example, and that any type of production process may be employed. It is considered that any film that falls within any of the following composition ranges exhibits similar characteristics:

① a film in which the ratio of the number of chromium atoms to the number of oxygen atoms is in the range of from 100:100 to 100:300;

② a film which satisfies the condition ① and in which the number of carbon atoms contained is not smaller than 2% of the number of chromium atoms;

③ a film which satisfies the condition ② and in which a larger number of carbon atoms are contained in a surface region within the depth of 3 nm from the film surface than in the other region;

④ a film which satisfies the condition ① and in which nitrogen atoms are contained in such a proportion that the total number of nitrogen and oxygen atoms is not larger than 350 per 100 chromium atoms;

⑤ a film which satisfies the condition ① and in which argon atoms are contained in such a proportion that the total number of argon and oxygen atoms is not larger than 350 per 100 chromium atoms; and ⑥ a film which satisfies any of the conditions ① to ⑤ and which contains impurity atoms other than chromium, oxygen, carbon, nitrogen and argon atoms within the range in which the refractive index for exposure light that is obtained by ellipsometry will not be changed by 0.1 or more.

In the experimental examples of the halftone phase shift photomask according to the first aspect of the present invention, the X-ray photoelectron spectroscopy was carried out as follows:

As an X-ray photoelectron spectroscope, ESCASCOPE, manufactured by VG SCIENTIFIC, England, was used.

The electron energy analyzer of ESCASCOPE was a 180° concentric hemispherical analyzer, and an X-ray photoelectron spectrum was measured by using a 6-channel thoron detector.

The data processor was DEC Micro PDP11/53, and VGS DATA SYSTEM VGS5250 Version January 1992 was used as software to execute quantitative calculation and other processing.

The analyzer work function of this system was 4.51 eV. The basic performance of this system was as shown in the table below at 3d5/2 peak of Ag when measurement was carried out at 400 W using MgKα (1253.60 eV) as an exciting line X-ray source:

| Energy resolving power (eV) | 0.95 | 1.10 | 1.40 | 2.20 |
|---|---|---|---|---|
| Sensitivity (kcps/mm$^2$) | 130 | 260 | 480 | 930 |

The measuring conditions were as follows:

As an X-ray source, the exciting line of AlKα rays (1486.60 eV) was used, and measurement was carried out at 500 W.

The angle of incidence of X-rays was 60° from the normal to the sample. The detector was disposed on the line normal to the sample.

Measurement of the degree of vacuum was carried out by using MILLENIA SERIES IPGCI. The degree of vacuum was in the range of from $5 \times 10^{-10}$ mbar to $1 \times 10^{-6}$ mbar. The evacuation system was composed of an ion pump, StarCell power unit 929-0172 (220 l/s), manufactured by Varian, and a titanium sublimation pump by VGSPS7 SUBLIMATION PUMP CONTROLLER.

As an analysis region, a region of about 1 mm or less in diameter was measured.

The XPS spectrum was measured for each binding energy as follows:

Wide scan: 1,000 eV to 0 eV (B. E.)

Cr 2p: 620 eV to 570 eV (B. E.)

O 1s: 560 eV to 520 eV (B. E.)

C 1s: 320 eV to 270 eV (B. E.)

N 1s: 430 eV to 380 eV (B. E.)

All the measuring operations were carried out in the CAE mode. In the wide scan, the pass energy was 60 eV, with 1 eV step, and the number of times of scanning was 2. In the other cases, the pass energy was 50 eV, with 0.1 eV step, and the number of times of scanning was 5. In all the cases, the channel time was 100 ms.

Although these measuring conditions were adopted in the present invention, it should be noted that these conditions are merely an example, and that in the case of an ordinary system, measurement may be carried out in any practically adequate range in which resolving power and sensitive are not considerably impaired, with the amount of electric charge taken into consideration. The element composition quantitative calculation procedure was as follows:

The subtraction of the background was made by using the Shirley type in the software. Determination of the background was made by giving careful consideration so that there would be no effect of a satellite of the main peak and that the most natural peak configuration would be obtained. The quantitative calculation was made on the basis of Scofield's relative sensitivity coefficients in the software. That is, the peak area obtained by measurement was divided by the relative sensitivity coefficient, and the composition ratio of each element was calculated from the resulting quotient.

As the composition ratio of each constituent element, the value of the calculated composition ratio that had become approximately constant independently of the etching time was employed.

The Scofield's relative sensitivity coefficients are as follows:

Carbon: 1.00

Oxygen: 2.85

Chromium: 7.60

Nitrogen: 1.77

Argon: 3.13

The etching conditions were as follows:

As an ion gun, EX05 differential exhaust type two-stage electrostatic lens-mounted electron bombardment ion gun was used, and as a controller, 400X gun supply unit was used. The magnification of the physical image unit was set at 1.

For measurement of the sample current, 626 sample current meter was used.

Etching was carried out in the vacuum range of from $1\times10^{-7}$ mbar to $1\times10^{6}$ mbar and in the sample current range of about $-0.5$ μA to $-1.0$ μA.

The filament current was 2.2 A, the emission current was 5 mA to 10 mA, and the source energy was 3 KV to 5 KV.

As an etching gas, Ar or Ne was used.

The etching time depended on the etch rate of the substrate. Etching and XPS spectral measurement were alternately carried out until the existence ratio of each particular element detected was regarded as being approximately constant.

Charge correction using an electron gun was not carried out.

The above-described measuring conditions and etching conditions in the present invention are merely an example. In general, measurement of equal spectrum quality can be made under other conditions as long as sensitivity and resolving power are not impaired.

As has been described above, the halftone phase shift photomask and halftone phase shift photomask blank of the present invention have on a transparent substrate a halftone phase shift layer which includes at least one layer composed mainly of a chromium compound, wherein the ratio of the number of chromium atoms to the number of oxygen atoms in the layer composed mainly of a chromium compound, when measured by X-ray photoelectron spectroscopy, falls within the range of from 100:100 to 100:300.

In this case, it is preferable that the number of carbon atoms contained in the layer composed mainly of a chromium compound should be not smaller than 2% of the number of chromium atoms. In this case, it is preferable that a larger number of carbon atoms should be contained in a surface region within the depth of 3 nm from the film surface than in the other region.

It is also preferable that nitrogen atoms should be contained in such a proportion that the total number of nitrogen and oxygen atoms is not larger than 350 per 100 chromium atoms. Alternatively, it is preferable that argon atoms should be contained in such a proportion that the total number of argon and oxygen atoms is not larger than 350 per 100 chromium atoms.

Under the above-described conditions, the layer composed mainly of a chromium compound may contain impurity atoms other than chromium, oxygen, carbon, nitrogen and argon atoms within the range in which the refractive index for exposure light that is obtained by ellipsometry will not be changed by 0.1 or more.

The layer that constitutes a halftone phase shift layer is preferably formed on the transparent substrate so that the phase difference φ, which is obtained by the following equation, is nπ±π/3 radians (n is an odd number):

$$\phi = \sum_{k=1}^{m-1} x^{k,k+1} + \sum_{k=2}^{m-1} 2(u_k - 1)d_k/\lambda \qquad (1)$$

where φ is the phase change occurring on light when perpendicularly transmitted through a photomask having a multilayer (m−2 layers) film formed on a substrate, $x^{k,k+1}$ is the phase change occurring at the interface between the k-th layer and the (k+1)th layer, $u_k$ and $d_k$ are the refractive index of a material constituting the k-th layer and the thickness of the k-th layer, respectively, and λ is the wavelength of exposure light. It is assumed here that the layer of k=1 is the substrate, and the layer of k=m is air.

Further, the layer that constitutes a halftone phase shift layer is preferably formed on the transparent substrate at such a thickness that the transmittance for exposure light is in the range of from 1% to 50%.

The present inventors also conducted exhaustive studies in order to develop a practical and highly accurate halftone phase shift photomask, and as a result, we have found that the following advantages ① to ⑤ are obtained by forming a semitransparent film of a halftone phase shift photomask in a multilayer structure, particularly a double- or triple-layer structure including a chromium nitride layer and a chromium oxide nitride carbide layer:

① the transmittance at the long wavelength side can be held down to a relatively low level;

② the semitransparent film can be provided with charge-up preventing properties;

③ the control of transmittance can be facilitated without changing the phase difference of the exposure wavelength;

④ the reflectivities of the obverse and reverse surfaces can be controlled; and

⑤ the film thickness of each layer can be controlled with the film composition of each layer maintained as it is, thereby realizing an optimal multilayer structure for each of at least two different kinds of exposure light.

Thus, the halftone phase shift photomask according to the second aspect of the present invention has been accomplished on the basis of the above finding.

That is, according to the second aspect of the present invention, there is provided a halftone phase shift photomask having on a transparent substrate a region which is semitransparent to exposure light and a region which is transparent to the exposure light so that the phase difference between light passing through the transparent region and light passing through the semitransparent region is substantially 180°. The halftone phase shift photomask is characterized in that:

(1) a semitransparent film that constitutes the semitransparent region is arranged in the form of a double-layer film which includes, in order from the transparent substrate side, a single-layer film 3 of a compound selected from among chromium oxide, chromium oxide nitride, chromium oxide carbide, and chromium oxide nitride carbide, and a single-layer film 4 of either chromium or chromium nitride, as shown in FIG. 10; or (2) the semitransparent film is arranged in the form of a double-layer film which includes, in order from the transparent substrate side, a single-layer film 5 of either chromium or chromium nitride, and a single-layer film 6 of a compound selected from among chromium oxide, chromium oxide nitride, chromium oxide carbide, and chromium oxide nitride carbide, as shown in FIG. 11; or (3) the semitransparent film is arranged in the form of a triple-layer film which includes, in order from the transparent substrate side, a single-layer film 7 of a compound selected from among chromium oxide, chromium oxide nitride, chromium oxide carbide, and chromium oxide nitride carbide, a single-layer film 8 of either chromium or chromium nitride, and a single-layer film 9 of a compound selected from among chromium oxide, chromium oxide nitride, chromium oxide carbide, and chromium oxide nitride carbide, as shown in FIG. 12.

The present invention also includes a blank for producing such a halftone phase shift photomask and methods of producing the halftone phase shift photomask and the halftone phase shift photomask blank.

In general, the above-described chromium, chromium oxide, chromium nitride, chromium oxide nitride, chromium oxide carbide and chromium oxide nitride carbide films are produced by using sputtering. However, vapor deposition, ion plating, CVD (Chemical Vapor Deposition), etc. may also be used.

The thickness of a multilayer film that constitutes the semitransparent film should be adjusted so that in the following expression (2), a is in the range of from ⅓ to ⅔, i.e., ⅓≦a≦⅔:

$$a = \Sigma_i d_i (n_i - 1)/\lambda \quad (2)$$

where $\lambda$ is the exposure wavelength, $d_i$ is the thickness of the i-th layer constituting the semitransparent film, $n_i$ is the refractive index of the i-th layer for the exposure wavelength, and $\Sigma_i$ indicates summation with respect to i. It is the best that a is in the vicinity of ½, as a matter of course. The above matter may be expressed in another form. That is, the semitransparent film should be formed on the transparent substrate so that the phase difference $\Phi$ between the film and an air layer of the same thickness, which is obtained by the following equation (3), falls within the range of $n\pm/3$ radians (n is an odd number):

$$\Phi = \sum_{k=2}^{m-1} 2\pi(n_k - 1) d_k/\lambda \quad (3)$$

where $\Phi$ is the phase difference of light perpendicularly passing through a photomask having a multilayer (m−2 layers) film formed on a transparent substrate, $n_k$, $d_k$ are the refractive index and thickness, respectively, of a material constituting the k-th layer, and $\lambda$ is the wavelength of exposure light. It is assumed here that the layer of k=1 is the transparent substrate, and the layer of k=m (m>3; m is an integer) is air.

With regard to the transmittance of the semitransparent film, when the transmittance of the transparent region is assumed to be 100%, the transmittance of the semitransparent region should be adjusted to be 1% to 50%, preferably 3% to 20%. By doing so, a satisfactorily effective halftone phase shift photomask can be obtained.

FIG. 14 shows the spectral transmittance of chromium nitride of 14 nm in thickness in the wavelength range of from 200 nm to 800 nm. As will be understood from the graph, chromium nitride has flat spectral characteristics over the wavelength range of from 300 nm to 800 nm. Accordingly, the transmittance at the long wavelength side can be held down to a relatively low level by using chromium nitride.

FIG. 13 shows the spectral transmittance in the wavelength range of from 200 nm to 800 nm in the double-layer film of chromium nitride and chromium oxide according to the second aspect of the present invention. It will be understood by making comparison with the spectral transmittance in the single-layer film shown in FIG. 18 that in the double-layer film the transmittance at the long wavelength side in the visible region is lower than that in the single-layer film. Accordingly, it is possible to perform inspection with an ordinary inspection apparatus KLA-219e (manufactured by KLA) whereby two semiconductor chips are comparatively inspected.

The following is a description of the charge-up preventing effect in electron beam lithography of an electron beam resist used as a mask for processing a semitransparent film.

If a chromium or chromium nitride film, which is electrically conductive, is used as any of the upper, intermediate and lower layers with respect to an ordinary chromium oxide nitride carbide film, electric charge accumulated on or in the semitransparent film during electron beam lithography is grounded through the chromium or chromium nitride film. Thus, charge-up can be prevented. For the charge-up preventing effect, the above-described structure (1) is most effective, but the structures (2) and (3) can also produce satisfactory charge-up preventing effect.

With such a structure, transmittance controllability for the exposure wavelength also improves. It is difficult to independently control the refractive index and the extinction coefficient by film forming conditions. In the case of a single-layer structure, it is necessary in order to obtain different transmittances of 7%, 10% and 15%, for example, to set film forming conditions for each transmittance. In the case of a multilayer structure, on the other hand, the transmittance can be controlled by the thickness of the chromium or chromium nitride film and the phase difference can be controlled by the thickness of the chromium oxide nitride carbide film. Therefore, the transmittance control becomes easier. The reason for this is as follows. Since the extinction coefficient of chromium or chromium nitride is large, the transmittance changes to a considerable extent with a slight change in film thickness, but the change in the phase difference is small. For a change in the phase difference, on the other hand, correction can be made with the thickness of the chromium oxide nitride carbide film.

According to M. Born, E. Wolf "Principles of Optics", pp.628–632, the transmittance T of an absorbing film is given by $$T = (n_3/n_1) \times \tau_{12}^2 \tau_{23}^2 \exp(-2 \times k_2 \times \eta)/\{1 + \rho_{12}^2 \rho_{23}^2 \exp(-4 \times k_2 \times \eta) + 2 \times \rho_{12}\rho_{23}\exp(-2 \times k_2 \times \eta)\cos(\phi_{12} + \phi_{23} + 2 \times n_2 \times \eta)\} \quad (4)$$

where $n_2$ and $k_2$ are the refractive index and extinction coefficient, respectively, of the absorbing film for the exposure wavelength, $n_1$ and $k_1$ are the refractive index and extinction coefficient, respectively, of the entrance-side substance of the absorbing film for the exposure wavelength, and $n_3$ and $k_3$ are the refractive index and extinction coefficient, respectively, of the exit-side substance of the absorbing film for the exposure wavelength, which refractive indices and extinction coefficients satisfy the following conditions:

$$\rho_{12} \times \exp(i \times \phi_{12}) = \quad (5)$$
$$\{(n_1 + i \times k_1) - (n_2 + i \times k_2)\}/\{(n_1 + i \times k_1) + (n_2 + i \times k_2)\}$$

$$\tau_{12} \times \exp(i \times x_{12}) =$$
$$\{2 \times (n_1 + i \times k_1)\}/\{(n_1 + i \times k_1) + (n_2 + i \times k_2)\}$$

$$\rho_{23} \times \exp(i \times \phi_{23}) =$$
$$\{(n_2 + i \times k_2) - (n_3 + i \times k_3)\}/\{(n_2 + i \times k_2) + (n_3 + i \times k_3)\}$$

$$\tau_{23} \times \exp(i \times x_{23}) =$$
$$\{2 \times (n_2 + i \times k_2)\}/\{(n_2 + i \times k_2) + (n_3 + i \times k_3)\}$$

$$\eta = 2\pi \times h/\lambda$$

where h is the thickness of the absorbing film, and $\lambda$ is the exposure wavelength. Further, it is assumed that normal incidence is carried out. In the case of a multilayer structure, the overall transmittance can be calculated from the product of the transmittances of the constituent layers.

Reflectivity control can be realized when the above-described structure (3) is adopted. With the structure (3), it is possible to vary the thickness proportions of the upper and lower chromium oxide nitride carbide films 7 and 9. The spectral reflectivities of chromium and chromium nitride are only slightly dependent on wavelength and relatively high. The chromium oxide nitride carbide films 7 and 9, which are formed on the upper and lower sides of the chromium film 8, serve as anti-reflection films utilizing multiple interference. Therefore, the interference peak varies with the film thickness, and hence the reflectivity for the exposure wavelength can be controlled.

Assuming the structure shown in FIG. 12, the reflectivity R is given by $$R = \{\rho_{12}^2 \exp(2 \times k_2 \times \eta) + \rho_{23}^2 \exp(2 \times k_2 \times \eta) + 2 \times \rho_{12} \times \qquad (6)$$

$$\rho_{23} \times \cos(\phi_{12} + \phi_{23} + 2 \times n_2 \times \eta)\}/\{\exp(2 \times k_2 \times \eta) + \rho_{12}^2 \times$$

$$\rho_{23}^2 \exp(-2 \times k_2 \times \eta) + 2 \times \rho_{12} \times \rho_{23} \times \cos(\phi_{12} + \phi_{23} + 2 \times n_2 \times \eta)\}$$

where $n_2$ and $k_2$ are the refractive index and extinction coefficient, respectively, of the absorbing film 8 for the exposure wavelength, $n_1$ and $k_1$ are the refractive index and extinction coefficient, respectively, of the entrance-side substance 7 or 9 for the exposure wavelength, and $n_3$ and $k_3$ are the refractive index and extinction coefficient, respectively, of the exit-side substance 9 or 7 for the exposure wavelength, which refractive indices and extinction coefficients satisfy the following conditions:

$$\rho_{12} \times \exp(i \times \phi_{12}) = \qquad (5)$$

$$\{(n_1 + i \times k_1) - (n_2 + i \times k_2)\}/\{(n_1 + i \times k_1) + (n_2 + i \times k_2)\}$$

$$\rho_{23} \times \exp(i \times \phi_{23}) =$$

$$\{(n_2 + i \times k_2) - (n_3 + i \times k_3)\}/\{(n_2 + i \times k_2) + (n_3 + i \times k_3)\}$$

$$\eta = 2\pi \times h/\lambda$$

where h is the thickness of the absorbing film, and $\lambda$ is the exposure wavelength. Further, it is assumed that normal incidence is carried out.

For processing such a photomask, dry etching by a mixed gas of $Cl_2$ or $CH_2Cl_2$ and oxygen is generally used. It is also possible to use a mixed aqueous solution of ammonium ceric nitrate and perchloic acid in place of the dry etching process.

Even when such a multilayer structure is used, since the upper and lower layers are formed from films of a similar chromium compound, etching of the multilayer film can be completed by a single process. Thus, the multilayer structure invites no increase in the number of processing steps required.

Incidentally, when the semitransparent film has a structure which includes at least two layers, it is possible to realize a desired halftone phase shift photomask for each of two different exposure wavelengths (assumed to be $\lambda_A$ and $\lambda_B$) by using materials of the same composition for the constituent layers and selecting a thickness for each layer. This will be explained below more specifically.

Let us consider a double-layer structure. In a case where the first layer (light-shielding layer) and the second layer (shifter layer) are formed by using a material with which the refractive indices of the first and second layers for the exposure wavelength $\lambda_A$ are $n_{1A}$ and $n_{2A}$, respectively, first the thickness $h_{1A}$ of the first layer is determined so that the transmittance condition is satisfied (i.e., the transmittance has a substantial value). Then, the thickness $h_{2A}$ of the second layer may be determined so that the phase condition (2) is satisfied, that is, the following condition is satisfied:

$$[(n_{1A}-1)h_{1A}+(n_{2A}-1)h_{2A}]\lambda_A = \frac{1}{2} \pm \frac{1}{6} \qquad (A)$$

Next, the procedure for determining the thicknesses $h_{1B}$ and $h_{2B}$ of the first and second layers for the exposure wavelength $\lambda_B$ will be explained. It is assumed that the same material as the above is used. In such a case also, the refractive indices of the first and second layers are $n_{1B}$ and $n_{2B}$, which are different in values from $n_{1A}$ and $n_{2A}$. First, $h_{1B}$ is determined so that the transmittance condition is satisfied. Then, $h_{2B}$ may be determined so that the phase condition (2) is satisfied, that is, the following condition is satisfied:

$$[(n_{1B}-1)h_{1B}+(n_{2B}-1)h_{2B}]\lambda_B = \frac{1}{2} \pm \frac{1}{6} \qquad (B)$$

On the other hand, in the case of a single-layer structure, since $h_{2A}=h_{2B}=0$, even when it is possible to determine $n_{1A}$ and $h_{1A}$ which satisfy the transmittance condition and the phase condition, that is, Equation (A), $h_{2A}$ which satisfies the phase condition, that is, Equation (B), is uniquely determined (because $n_{2A}$ is uniquely determined, in the case of the same material). Accordingly, it becomes impossible to satisfy the transmittance condition.

The present inventors also conducted exhaustive studies in order to develop a halftone phase shift photomask for which a physical cleaning process, e.g., brush cleaning, high-pressure water cleaning, ultrasonic cleaning, etc., which is used for cleaning ordinary photomasks, can be used as it is to effect satisfactory cleaning and which has vertical sections processed with high accuracy, and also a halftone phase shift photomask blank for producing the halftone phase shift photomask. As a result, we have come to accomplish the halftone phase shift photomask and halftone phase shift photomask blank according to the third aspect of the present invention.

That is, according to the third aspect of the present invention, there is provided a halftone phase shift photomask having on a transparent substrate a transparent region and a semitransparent region which is defined by a semitransparent layer of a chromium compound formed by physical vapor deposition, wherein when the transmittance of the transparent region for the wavelength of exposure light applied during transfer is assumed to be 100%, the transmittance of the semitransparent region falls within the range of from 3% to 35%, and the semitransparent region shifts the phase of the exposure wavelength through substantially 180° with respect to the transparent region.

In this case, it is preferable that the chromium compound should consist essentially of chromium and oxygen, or chromium, oxygen and nitrogen, or chromium, oxygen and carbon, or chromium, oxygen, nitrogen and carbon, and that the semitransparent layer should be formed from a single-layer film or a multilayer film including two or more layers.

In addition, according to the third aspect of the present invention, there is provided a halftone phase shift photomask blank having on a transparent substrate a semitransparent layer of a chromium compound which is formed by physical vapor deposition, wherein when the transmittance of the transparent substrate for the wavelength of exposure light applied during transfer is assumed to be 100%, the transmittance of the semitransparent layer falls within the range of from 3% to 35%, and the amount of phase shift of the exposure wavelength by the semitransparent layer is substantially 180°.

In this case, it is preferable that the chromium compound should consist essentially of chromium and oxygen, or chromium, oxygen and nitrogen, or chromium, oxygen and carbon, or chromium, oxygen, nitrogen and carbon, and that the semitransparent layer should be formed from a single-layer film or a multilayer film including two or more layers.

Examples of physical vapor deposition for forming a chromium compound as a semitransparent layer include vacuum film forming methods such as sputtering, ion plating, vapor deposition, etc. In the present state of the art, however, sputtering is particularly preferable. When the transmittance of the transparent region or the transparent substrate is assumed to be 100%, the transmittance of the semitransparent layer should preferably fall within the range of from 3% to 35%, more preferably in the range of from 5% to 20%.

The chromium compound consists essentially of chromium and oxygen, or chromium, oxygen and nitrogen, or chromium, oxygen and carbon, or chromium, oxygen, nitrogen and carbon. The chromium compound may further contain a transition metal other than chromium, e.g., titanium, tungsten, tantalum, molybdenum, etc.

By arranging the semitransparent layer in the form of a multilayer film including two or more layers, it becomes possible to control etching characteristics during etching process on the basis of the difference in textural structure and component ratio between the constituent layers. Accordingly, the etching characteristics can be adjusted so that it is possible to obtain an even more vertical etched section than in the case of a single-layer film under the same continuous etching conditions.

Examples of preferable etching methods for the semitransparent layer are an ordinary wet etching process that uses a mixed aqueous solution of ammonium ceric nitrate and perchloic acid, and a dry etching process that uses a mixed gas prepared by adding oxygen to $Cl_2$, $CCl_4$, $CHCl_3$, $CH_2Cl_2$, etc.

The thickness of a multilayer film that constitutes the semitransparent film should be adjusted so that a=½ in the following expression:

$$a = \Sigma_i t_i (n_i - 1)/\lambda$$

where $\lambda$ is the wavelength of exposure light, $t_i$ is the thickness of each layer, $n_i$ is the refractive index of each layer for the exposure wavelength, and $\Sigma_i$ indicates summation with respect to i.

By doing so, the amount of phase shift becomes substantially 180°. It should be noted that the effect of the phase shift layer is recognized when a is in the range of from ⅓ to ⅔, i.e., ⅓≦a≦⅔. However, it is the best that a is in the vicinity of ½, as a matter of course.

In the halftone phase shift photomask and halftone phase shift photomask blank according to the first aspect of the present invention, the structure is simple, and the photoengraving process can be shortened. Accordingly, it is possible not only to achieve a reduction in cost and an improvement in yield but also to use the greater part of a production line for conventional chromium photomasks as it is. Therefore, the halftone phase shift photomask and halftone phase shift photomask blank can be put to practical use extremely easily.

In the halftone phase shift photomask and halftone phase shift photomask blank according to the second aspect of the present invention, the semitransparent film of the halftone phase shift photomask is arranged in a multilayer structure which includes one layer of a compound selected from chromium oxide, chromium oxide nitride, chromium oxide carbide, and chromium oxide nitride carbide, and one layer of chromium or chromium nitride. Accordingly, even when the transmittance of the chromium oxide, chromium oxide nitride, chromium oxide carbide or chromium oxide nitride carbide layer is relatively high at the long wavelength side, which is used for inspection and measurement of photomasks, it can take charge of the phase shifting function (that is, serve as a phase shift layer). On the other hand, the function of suppressing the rise of the transmittance at the long wavelength side can be assigned to the chromium or chromium nitride layer (that is, it serves as a transmittance control layer). Therefore, it is possible to control not only the transmittance for the wavelength of exposure light but also the transmittance at the long wavelength side as desired. Accordingly, the transmittance for the e-line, which is used for ordinary inspection and size measurement, can also be held down 30% or less. Thus, ordinary inspection and size measurement can be performed without problem.

In addition, since the multilayer structure includes an electrically conductive film, it is possible to prevent charge-up during electron beam exposure.

Further, since the semitransparent film has a multilayer structure formed from chromium compounds having different optical constants, the transmittance and reflectivity can be controlled by combination of film thicknesses.

Further, an optimal multilayer structure can be realized for each of at least two different kinds of exposure light by controlling the thickness of each layer with the film composition of each layer maintained as it is.

According to the third aspect of the present invention, the semitransparent layer of the halftone phase shift photomask is made of a chromium compound which is formed by physical vapor deposition. Accordingly, a physical cleaning process, e.g., brush cleaning, high-pressure water cleaning, ultrasonic cleaning, etc., which has heretofore been used for cleaning photomasks, can be used therefor as it is. It is therefore possible to produce a clean halftone phase shift photomask having quality equal or close to that of ordinary photomasks and also possible to obtain a clean halftone phase shift photomask blank. In addition, since the semitransparent layer of the halftone phase shift photomask has a thickness not larger than a half of the thickness of the conventional semitransparent layer formed by using coating glass, it is possible to produce a highly accurate halftone phase shift photomask having even more vertical processed sections.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

19

Figure 8:
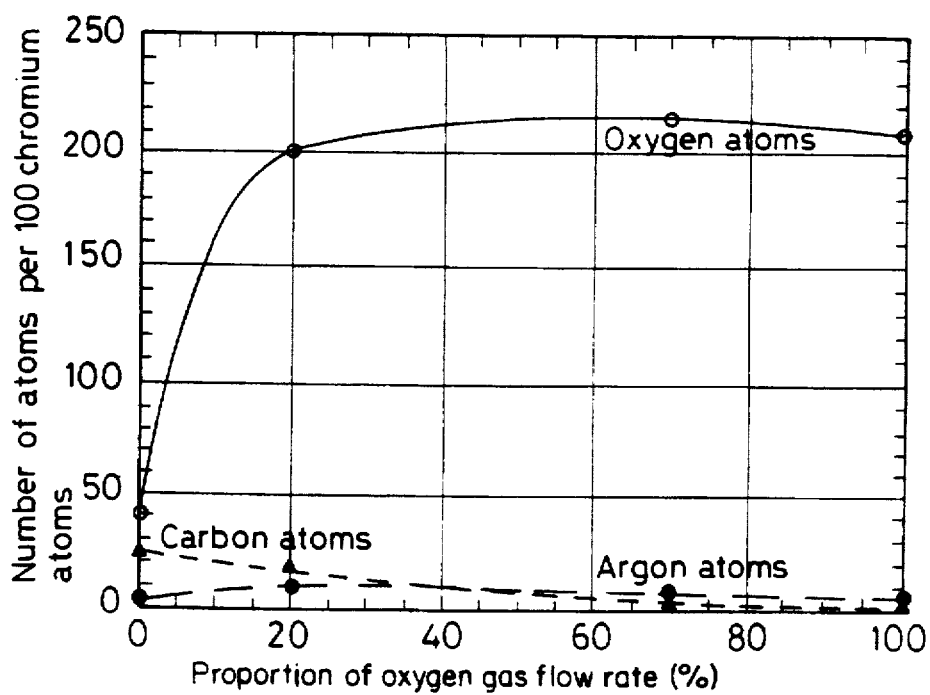

FIG. 8 is a graph showing the results of composition analysis by X-ray photoelectron spectroscopy of a chromium compound film formed with the oxygen gas/nitrogen gas flow rate ratio varied.

Figure 9:
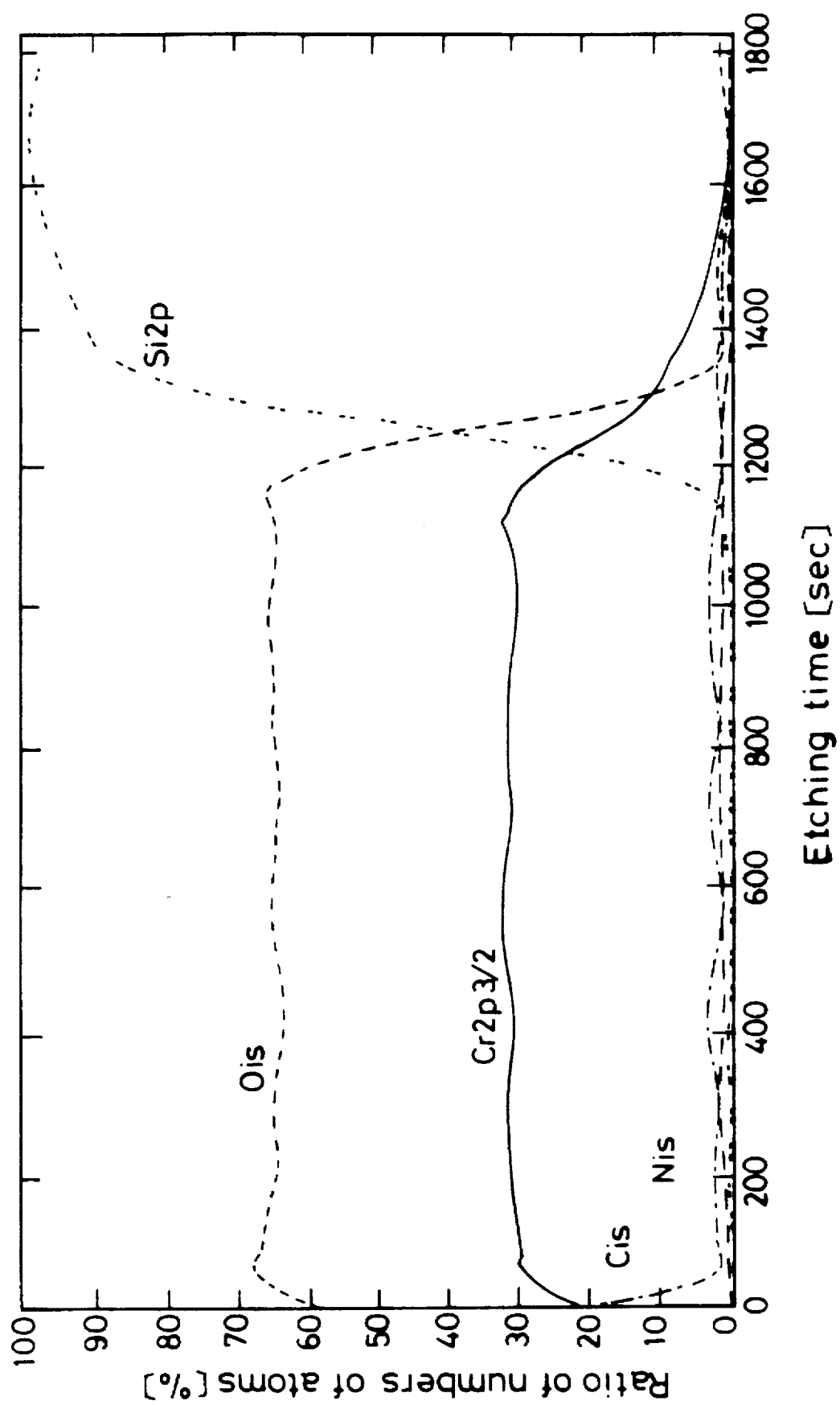

FIG. 9 is a graph showing the depthwise profile of the composition obtained by X-ray photoelectron spectroscopy.

Figure 10:
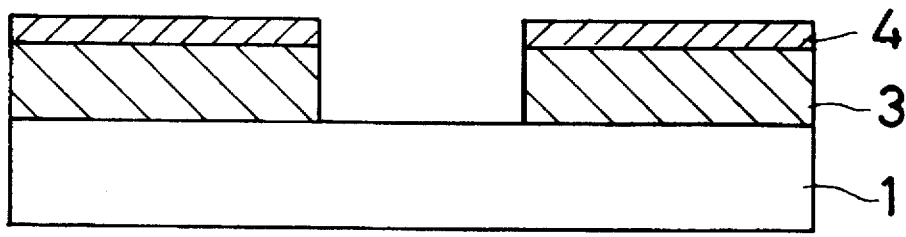

FIG. 10 is a sectional view schematically showing one form of the halftone phase shift photomask according to the second aspect of the present invention.

Figure 11:
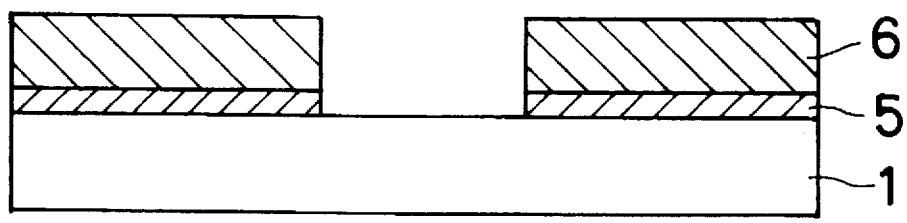

FIG. 11 is a sectional view schematically showing another form of the halftone phase shift photomask.

Figure 12:
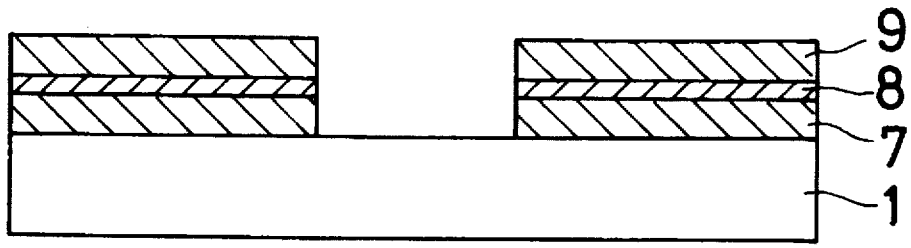

FIG. 12 is a sectional view schematically showing still another form of the halftone phase shift photomask.

Figure 13:
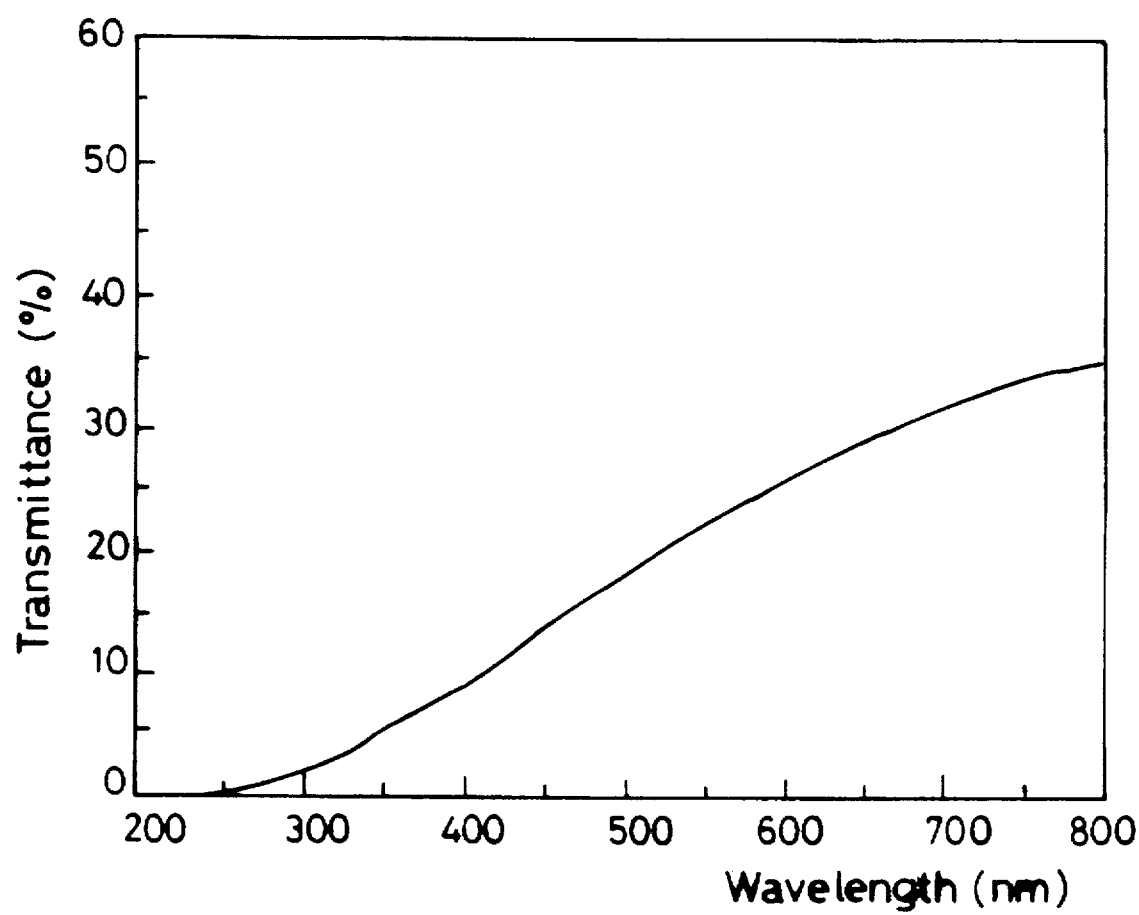

FIG. 13 is a graph showing the spectral transmittance of a double-layer film including chromium nitride and chromium oxide layers according to the second aspect of the present invention.

Figure 14:
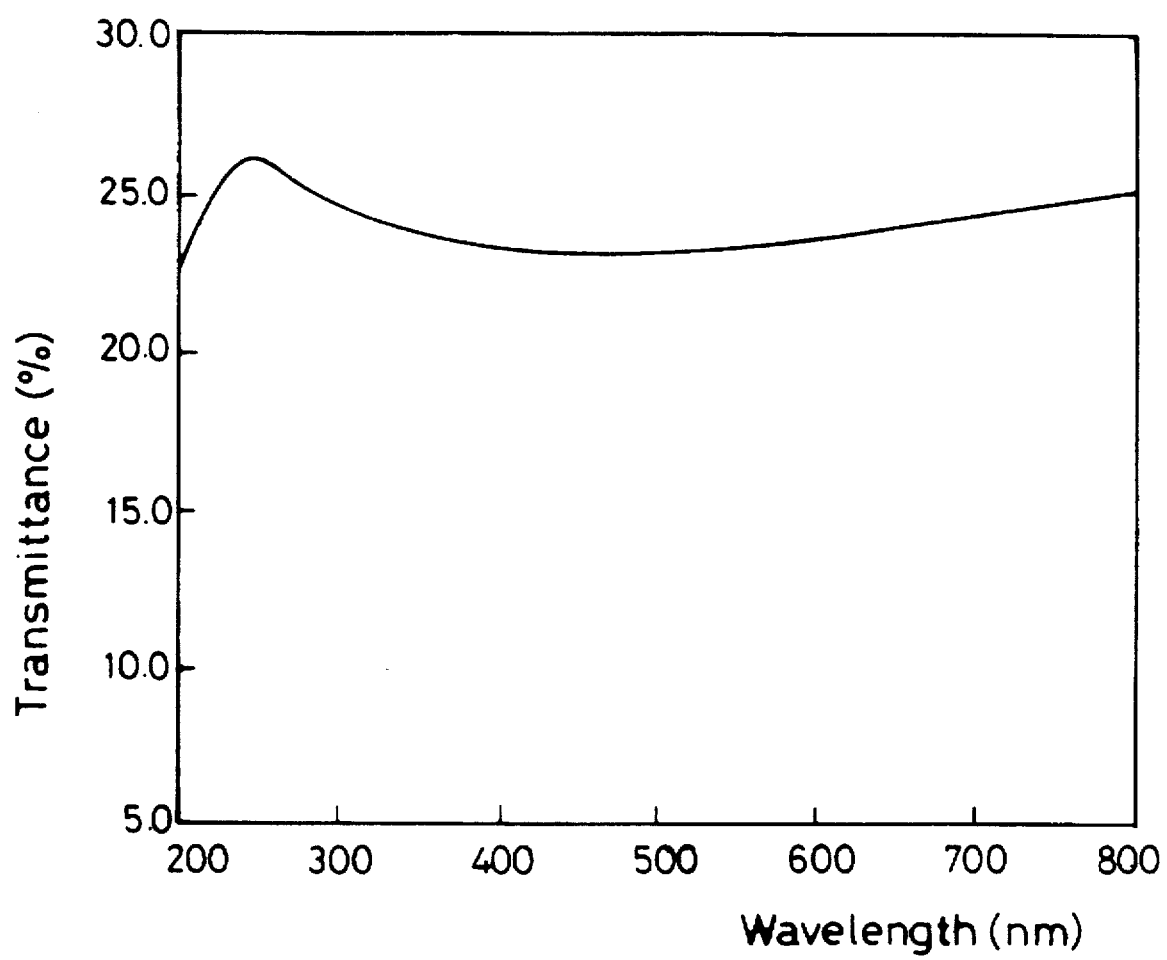

FIG. 14 is a graph showing the spectral transmittance of chromium nitride.

Figure 15:
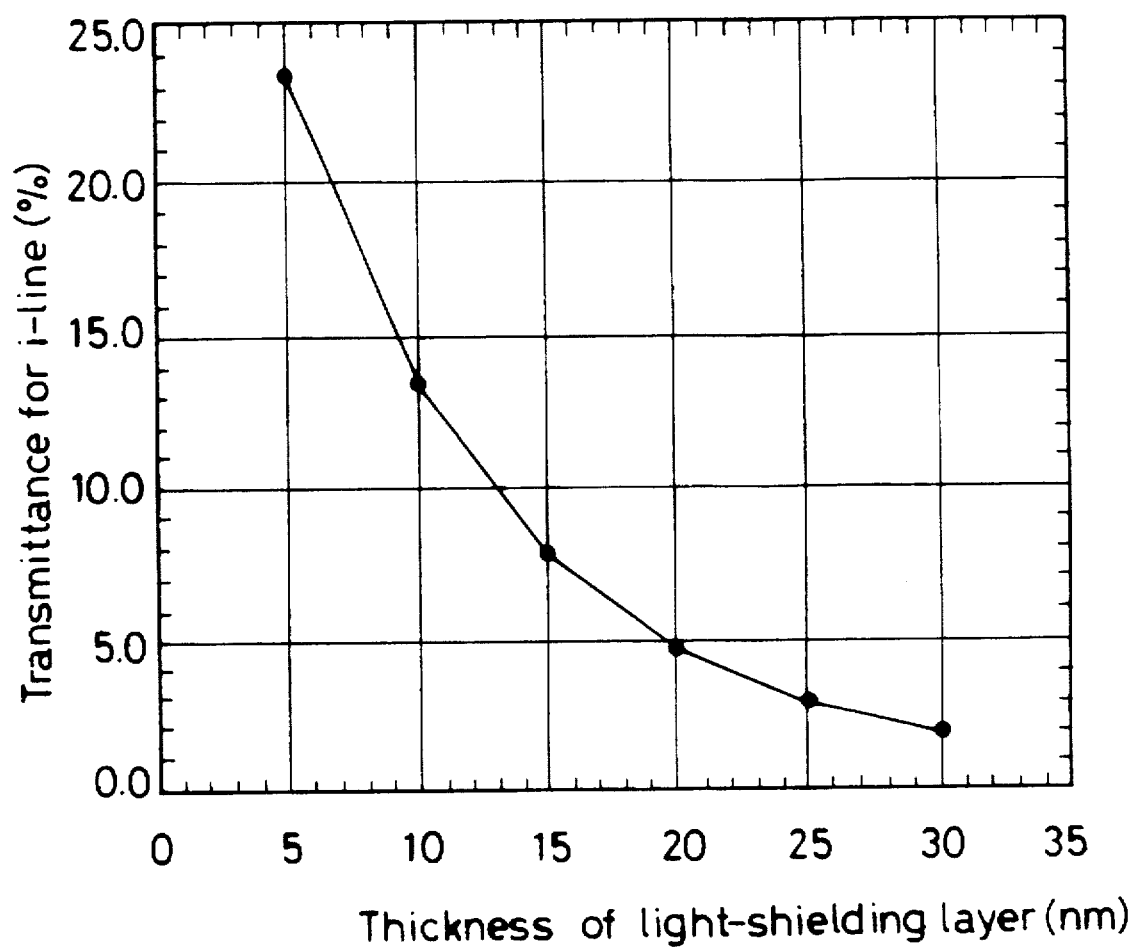

FIG. 15 is a graph showing the changes of transmittance for the i-line relative to the thickness of the light-shielding layer in the case of the layer configuration shown in FIG. 12.

Figure 16:
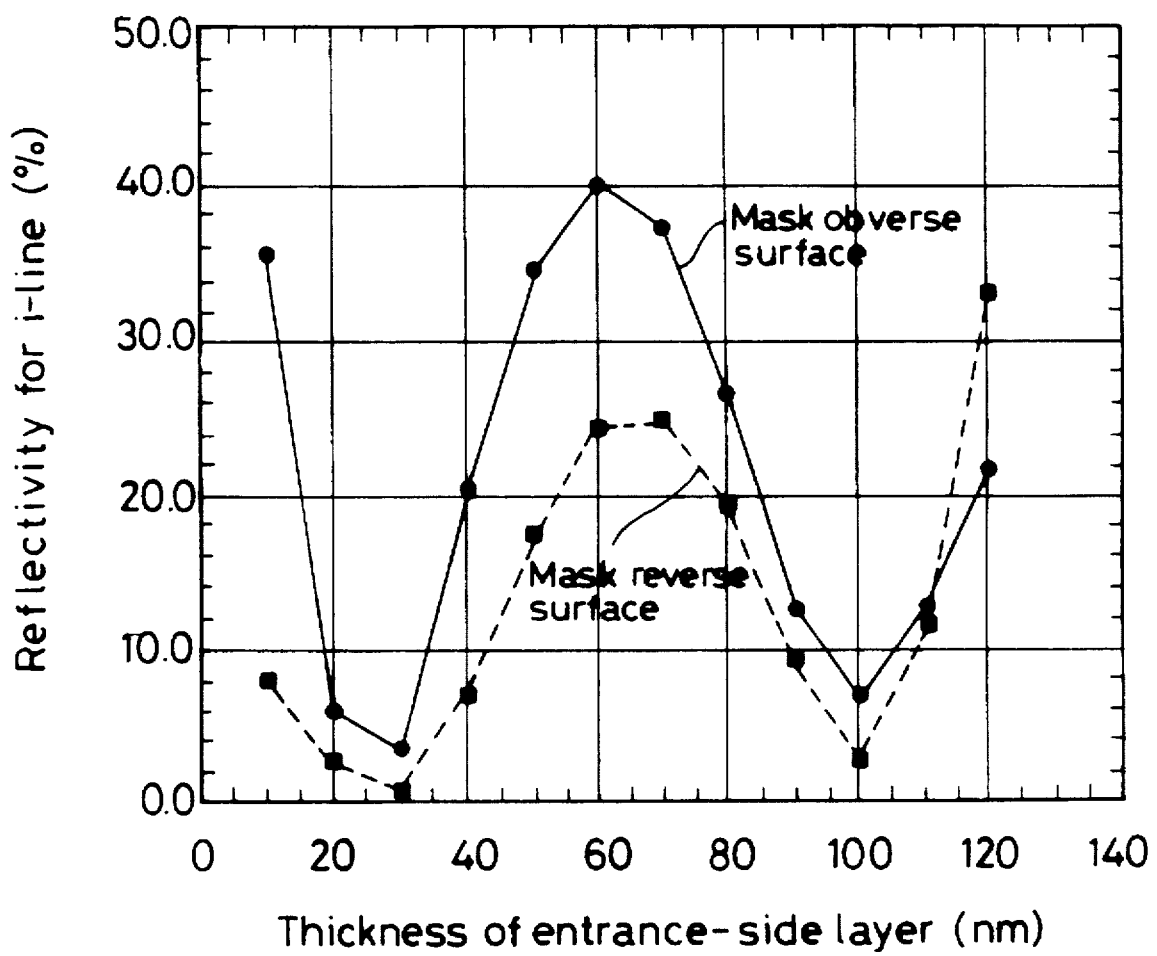

FIG. 16 is a graph showing the changes of reflectivity for the i-line relative to the thickness of the entrance-side layer in the case of the layer configuration shown in FIG. 12.

Figure 17:
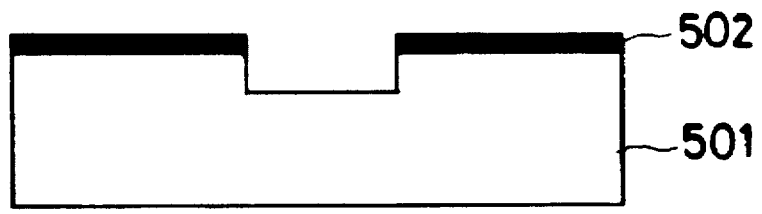

FIG. 17 is a sectional view showing the structure of a conventional halftone phase shift photomask.

Figure 18:
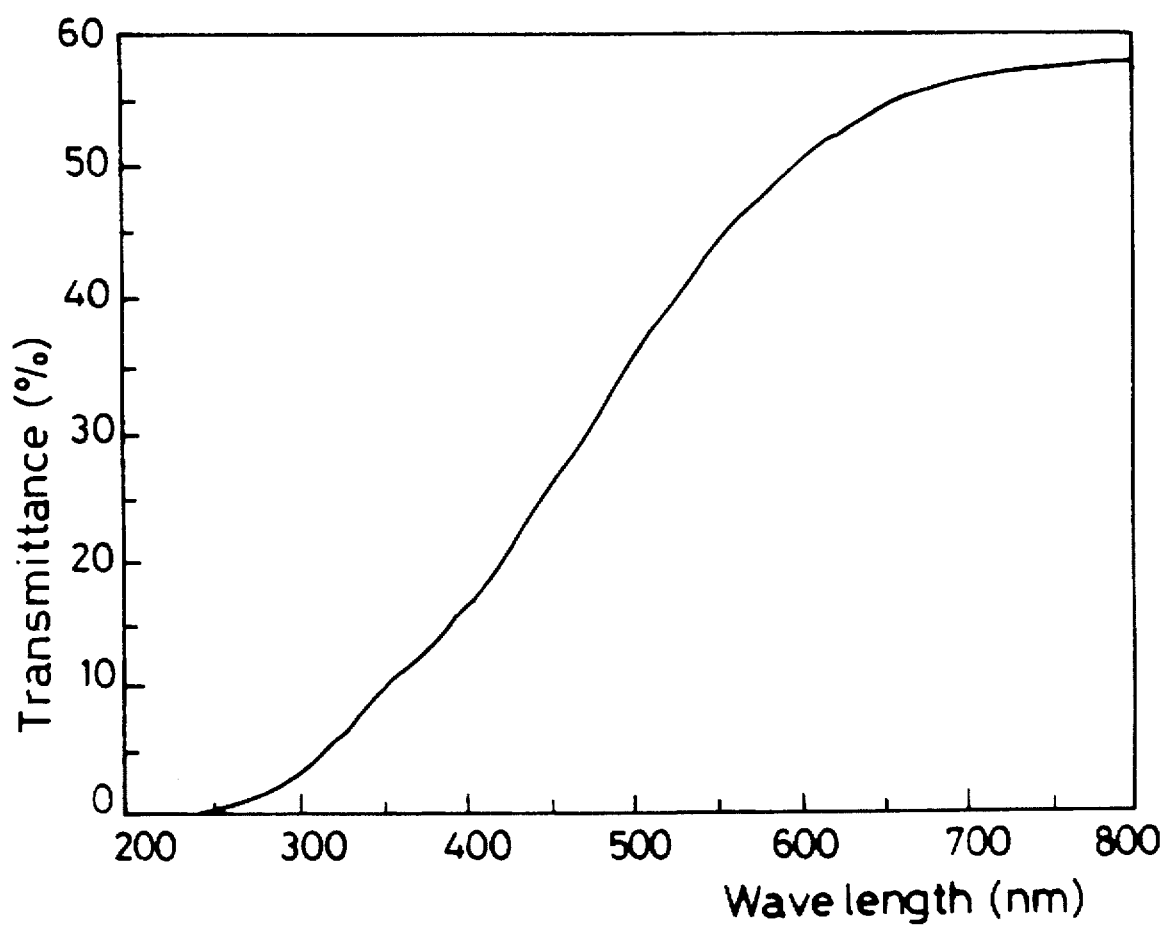

FIG. 18 is a graph showing the spectral transmittance of chromium oxide.

Figure 19:
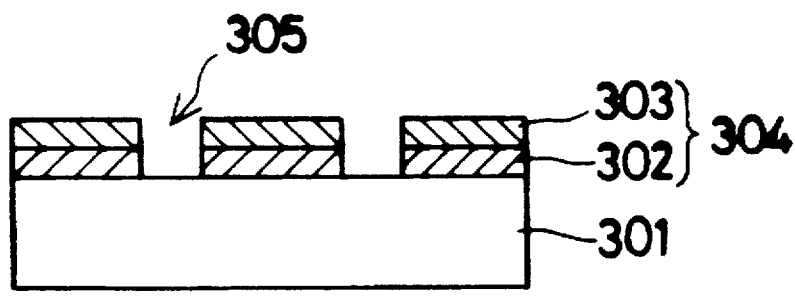

FIG. 19 is a sectional view schematically showing a halftone phase shift photomask in one example according to the third aspect of the present invention.

Figure 20:
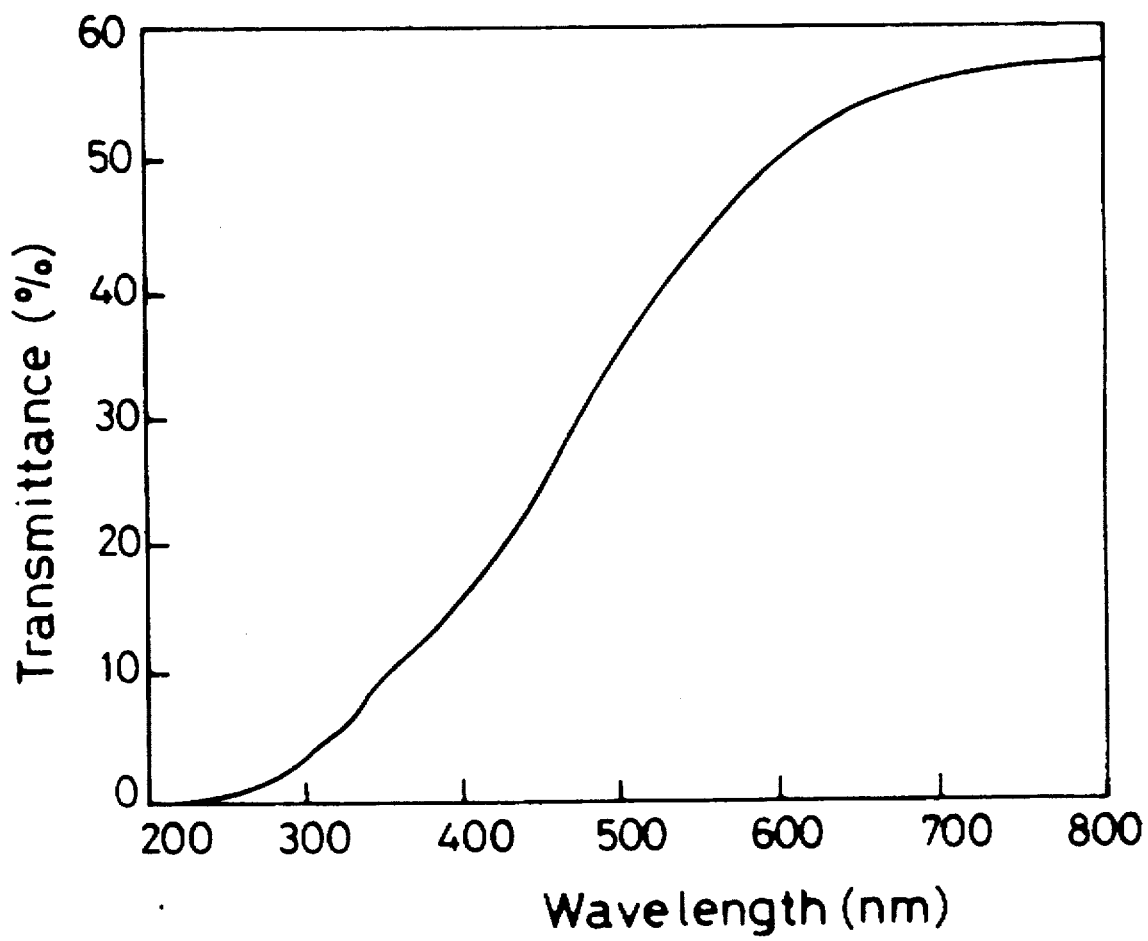

FIG. 20 is a graph showing the spectral transmittance in the semitransparent region of the halftone phase shift photomask in the example shown in FIG. 19.

Figure 21:
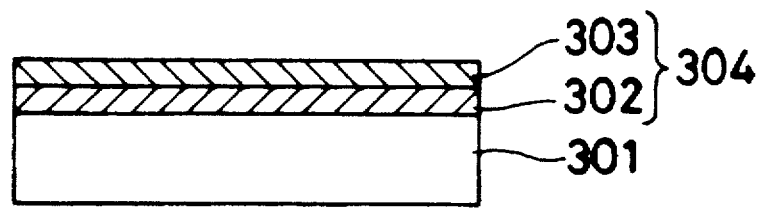
Figure 21:
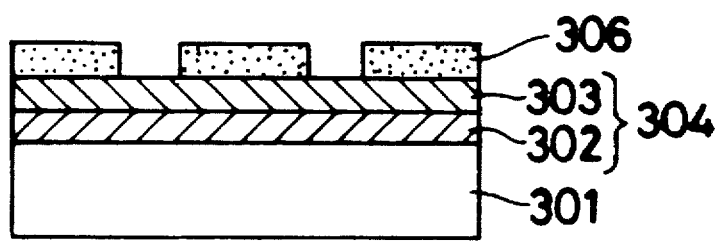
Figure 21:
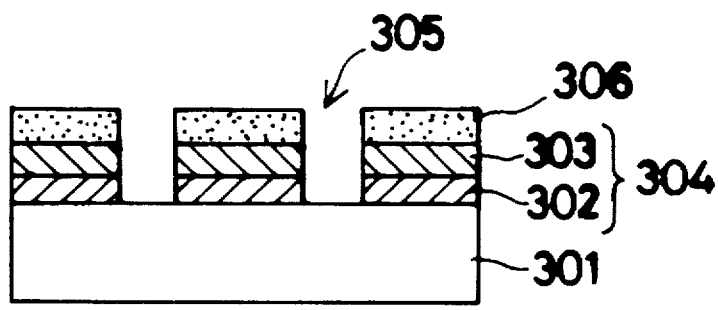

FIG. 21 is a sectional view showing the process sequence for producing the halftone phase shift photomask in the example shown in FIG. 19.

Figure 22:
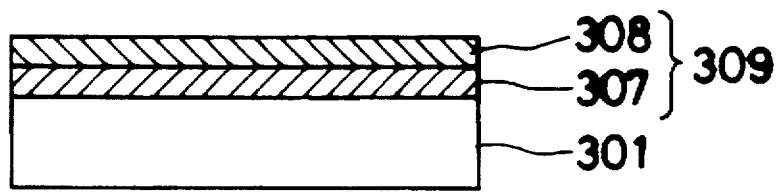

FIG. 22 is a sectional view of a halftone phase shift photomask blank in another example according to the third aspect of the present invention.

Figure 23:
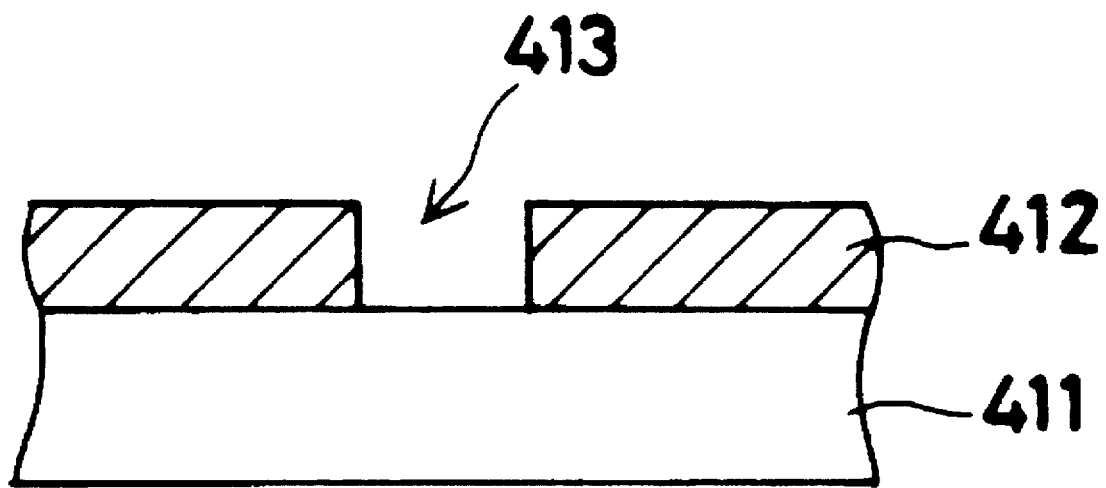

FIG. 23 is a sectional view of one example of conventional halftone phase shift photomasks.

DESCRIPTION OF THE PREFERRED EMBODIMENTS

The following is a description of examples of the halftone phase shift photomask, halftone phase shift photomask blank and producing methods therefor according to the present invention. In particular, Examples 1 and 2 correspond to the techniques according to the first aspect of the present invention, Examples 3 to 7 to those according to the second aspect of the present invention, and Examples 8 and 9 to those according to the third aspect of the present invention.

EXAMPLE 1

Figure 1A:
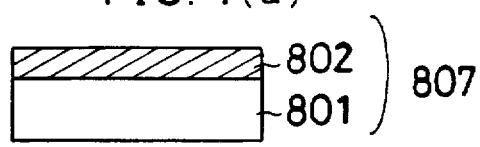
FIG. 1 is a sectional view showing the sequence of steps for processing a single-layer halftone phase shift photomask in Example 1 according to the first aspect of the present invention.

One example of a single-layer halftone phase shift photomask will be described below with reference to FIG. 1, which shows the process sequence for producing it. As shown in FIG. 1(a), on a mirror-polished silicon wafer 801, a chromium compound film 802 was formed to a thickness of about 50 nm by sputtering under the following conditions,

20 thereby obtaining a sample 807 for ellipsometry:

Film forming system: planar DC magnetron sputtering system

Target: metal chromium

Gas and flow rate: carbon dioxide gas 70 sccm+nitrogen gas 30 sccm

Sputter pressure: 3 mTorr

Sputter current: 6 A

Next, the sample 807 was measured for the refractive index u and extinction coefficient k at the i-line wavelength (365 nm) of a mercury lamp with a commercially available spectroellipsometer (ES-4G, manufactured by Sopra). The results were u=2.580 and k=0.374. With the sample 807 treated as a metal film shown in M. Born, E. Wolf "Principles of Optics", pp.628–632, mentioned above, a film thickness required for 180° shifting the phase of transmitted light of wavelength 365 nm by the film when formed on a high-purity synthetic quartz substrate used as a photomask substrate was calculated. The required film thickness was determined to be 118 nm.

Figure 1B:
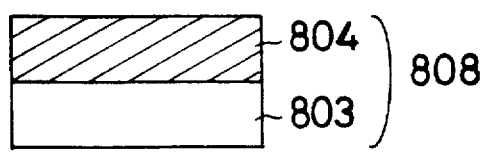

Accordingly, as shown in FIG. 1(b), a chromium compound film 804 was formed to a thickness of about 120 nm on an optically polished, satisfactorily cleaned high-purity synthetic quartz substrate 803 under the above-described film forming conditions, thereby obtaining a blank 808 for a single-layer halftone phase shift photomask according to the present invention wherein the transmittance for light of wavelength 365 m was about 15%.

It should be noted that the chromium compound was chromium oxide, nitride carbide.

Figure 1C:
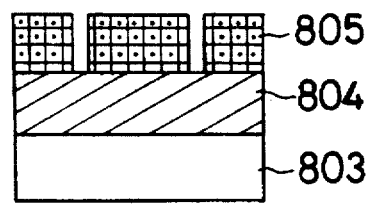
Figure 1E:
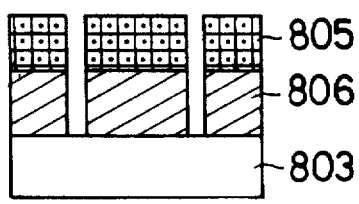
Figure 1D:
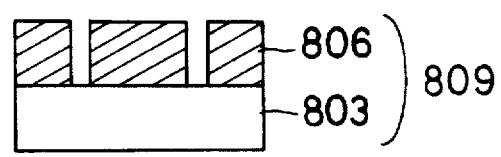

Next, as shown in FIG. 1(c), the surface of the blank 808 was provided with a desired resist pattern 805 of a material containing an organic substance as a principal component by conventional electron beam lithography or photolithography. Next, as shown in FIG. 1(d), the semitransparent film 804 exposed through the openings in the resist pattern 805 was subjected to a high-frequency plasma using a mixed gas of $CH_2Cl_2:O_2=1:2.5$ under the pressure of 0.3 Torr to effect selective dry etching, thereby obtaining a desired semitransparent film pattern 806. Finally, the remaining resist was removed by a conventional method, thus obtaining a single-layer halftone phase shift photomask 809 of the present invention, as shown in FIG. 1(e).

The single-layer halftone phase shift photomask was practicable in terms of all requirements, i.e., the dimensional accuracy of the etched portions, cross-sectional configuration, film thickness distribution, transmittance distribution, adhesion of the film to the substrate, etc.

EXAMPLE 2

Figure 2A:
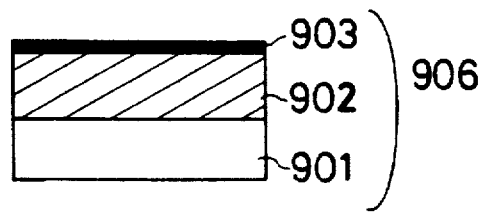
FIG. 2 is a sectional view showing the sequence of steps for processing a multilayer halftone phase shift photomask in Example 2.

One example of a multilayer halftone phase shift photomask will be described below with reference to FIG. 2, which shows the process sequence for producing it. In the same way as in Example 1, a sample for ellipsometry was prepared and measured for the refractive index and extinction coefficient, and a film thickness required for 180° shifting the phase of light of wavelength 365 nm was calculated on the basis of the measured refractive index and extinction coefficient. Thereafter, as shown in FIG. 2(a), a chromium compound 902 was actually formed to the calculated film thickness on a high-purity synthetic quartz substrate 901 under the following conditions. As a result, the transmittance for light of wavelength 365 nm was about 20%:

Film forming system: planar DC magnetron sputtering system

Target: metal chromium

Gas and flow rate: carbon dioxide gas 20 sccm+nitrogen gas 80 sccm

Sputter pressure: 3 mTorr

Sputter current: 6 A

Next, a metal chromium film 903 was formed to a thickness of about 10 nm on the chromium compound 902 under the following conditions, thus obtaining a blank 906 for a multilayer halftone phase shift photomask according to the present invention wherein the transmittance for light of wavelength 365 nm was about 12%:

Film forming system: planar DC magnetron sputtering system

Target: metal chromium

Gas and flow rate: argon gas 100 sccm

Sputter pressure: 3 mTorr

Sputter current: 6 A

Figure 2B:
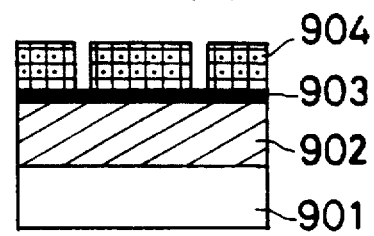
Figure 2C:
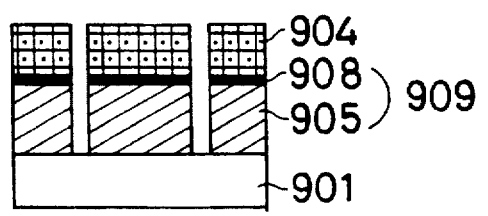
Figure 2D:
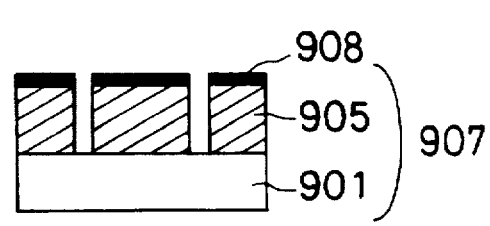
Figure 3A:
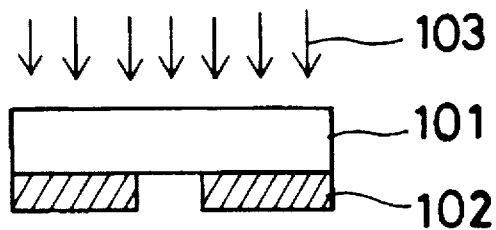
FIG. 3 shows the principle of halftone phase shift lithography.
Figure 3B:
Figure 3C:
Figure 3D:
Figure 4A:
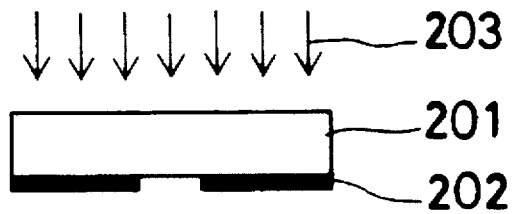
FIG. 4 shows the principle of a conventional method.
Figure 4B:
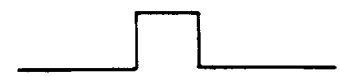
Figure 4C:
Figure 4D:
Figure 5:
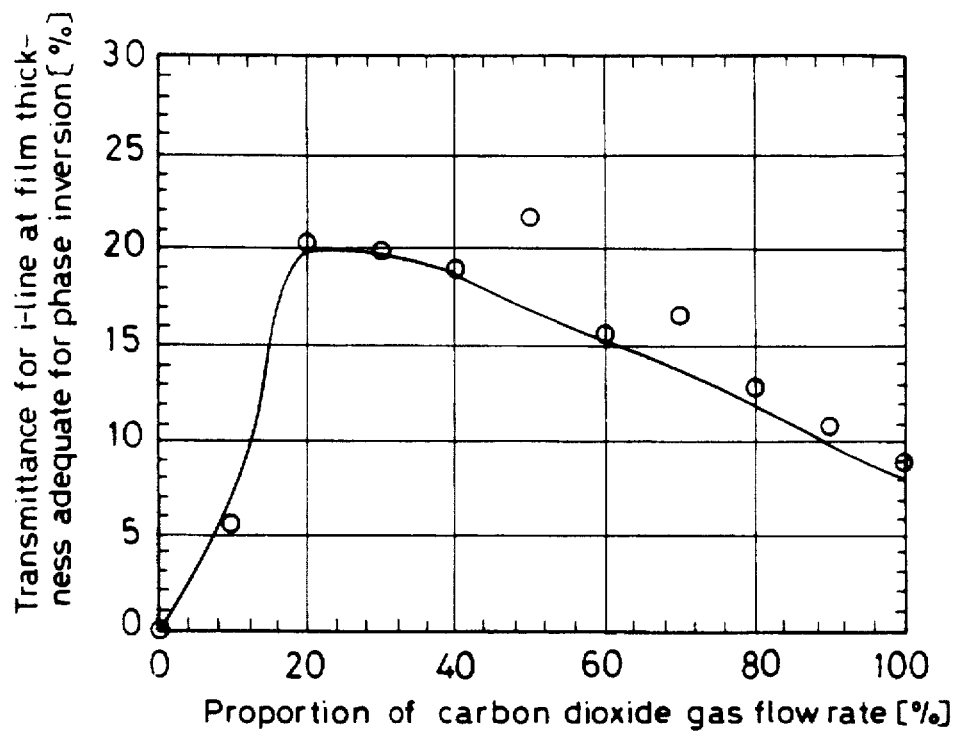
FIG. 5 is a graph showing the transmittance for the i-line of a chromium compound film formed with the carbon dioxide gas/nitrogen gas flow rate ratio varied, measured at a film thickness adequate for phase inversion.
Figure 6:
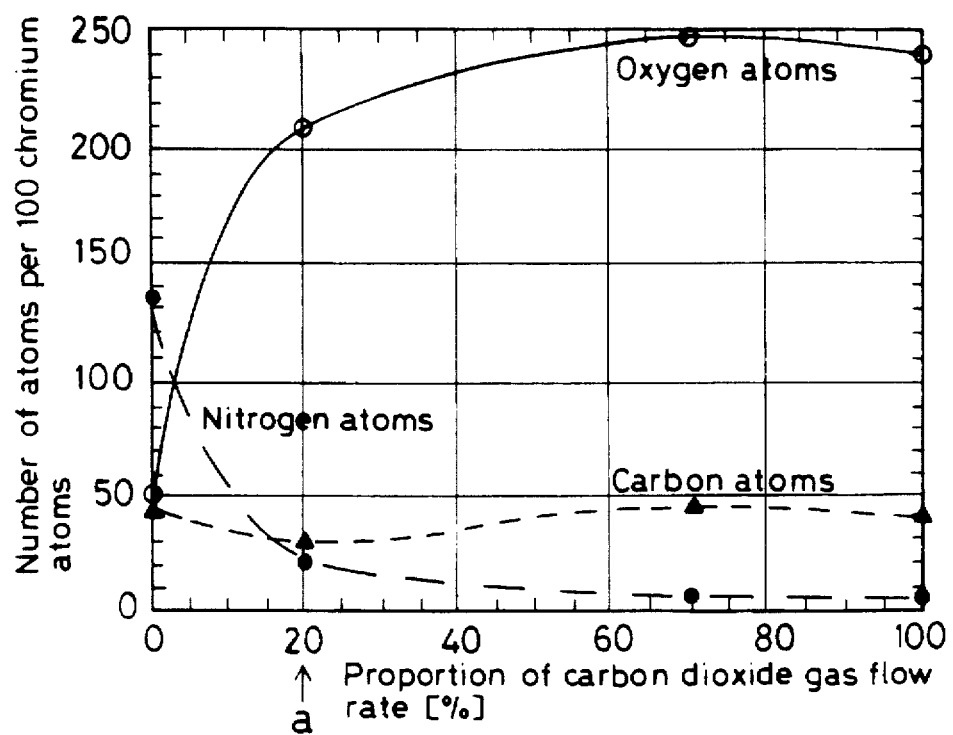
FIG. 6 is a graph showing the results of composition analysis of the film shown in FIG. 5 by X-ray photoelectron spectroscopy.
Figure 7:
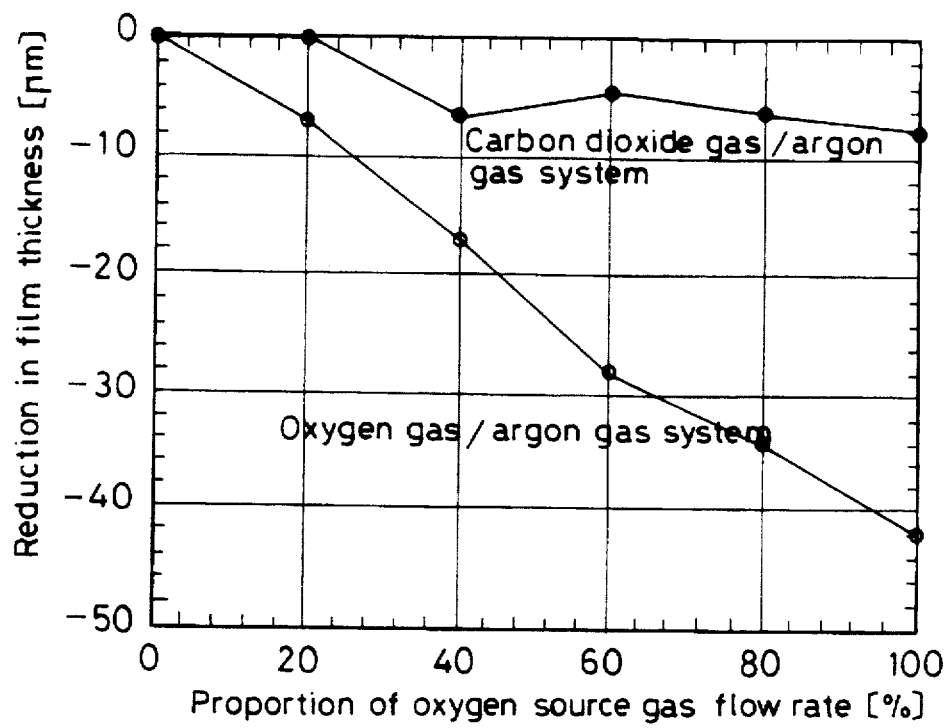
FIG. 7 is a graph showing the way in which the reduction in the film thickness caused by dipping in chemicals differs according to the kind of oxygen source gas used.

Next, as shown in FIG. 2(b), the surface of the blank 906 was provided with a desired resist pattern 904 of a material containing an organic substance as a principal component by a conventional electron beam lithography or photolithography. Next, as shown in FIG. 2(c), the semitransparent film exposed through the openings in the resist pattern 904 was subjected to a high-frequency plasma using a mixed gas of $CH_2Cl_2:O_2=1:2.5$ under the pressure of 0.3 Torr to effect selective dry etching, thereby obtaining a desired semitransparent film pattern 909 composed of a chromium compound pattern 905 and a metal chromium pattern 908. Finally, the remaining resist was removed by a conventional method, thus obtaining a multilayer halftone phase shift photomask 907 of the present invention, as shown in FIG. 2(d).

Since the layer 902 formed mainly of a chromium compound and the metal chromium film 903 have the same matrix comprised of chromium atoms, their etching characteristics are almost the same. Therefore, the patterning characteristics of the multilayer halftone phase shift photomask 907 are approximately the same as those of a single-layer halftone phase shift photomask such as that shown in Example 1.

This double-layer halftone phase shift photomask was also practicable in terms of all requirements, i.e., the dimensional accuracy, cross-sectional configuration, film thickness distribution, transmittance distribution, adhesion of the film to the substrate, etc.

EXAMPLE 3

First, a $CrO_xN_yC_z$ film was formed to a thickness of 125 nm on an optically polished quartz substrate. The transmittance of this film was 13% for the i-line (365 nm) and 45% for the e-line (546 nm). Next, a CrN film was formed to a thickness of 9 nm on the $CrO_xN_yC_z$ film. The transmittance of the CrN film was 60% for the i-line and 59% for the e-line. The overall transmittance of the double-layer film was 7.8% for the i-line and 26.6% for the e-line. The refractive index of the CrN film for the i-line was 1.9, while the refractive index of the $CrO_xN_yC_z$ film for the i-line was 2.4. In general, sputtering is used for forming these films.

Next, i-line resist NPR-895i (manufactured by Nagase Sangyo k. k.) was spin-coated on the blank thus obtained and then subjected to pre-bake, thereby forming a resist layer having a thickness of 0.1 μm to 2.0 μm. As a substrate, quartz and high-purity quartz substrates are preferably used. However, it is also possible to use low-expansion glass, $MgF_2$, $CaF_2$, etc. Heating of the resist layer is usually carried out for from 5 minutes to 60 minutes in the temperature range of from 80° C. to 150° C., although it depends on the kind of resist used.

Next, a desired pattern is formed by exposure using a laser aligner, e.g., CORE-2564 (manufactured by Etec Systems Inc.). Then, the resist is developed with a developer containing TMAH (tetramethylammonium hydride) as a principal component, and thereafter rinsed in water.

Next, according to need, heating and descum treatments are carried out to remove resist scum from the resist pattern. Thereafter, portions of the semitransparent film exposed through the openings in the resist pattern, which are to be processed, are subjected to dry etching by an etching plasma using $CH_2Cl_2+O_2$ gas, thereby forming a light-shielding pattern. It will be apparent that the formation of the light-shielding pattern may be effected by wet etching in place of the dry etching using etching gas plasma.

After the etching process, the remaining resist is removed by an oxygen plasma, thus completing a halftone phase shift photomask.

The transmittance of this mask was 10% for the i-line (365 nm) and 29% for the e-line. It was possible to perform inspection without problem by using a comparative inspection apparatus KLA-219HRL-PS (manufactured by KLA). It was also possible to carry out size measurement without problem using a transmission size measuring apparatus MPA MPA-3 (manufactured by Nikon Corporation).

Next, the transfer characteristic improving effect produced by using the phase shift photomask of the present invention will be explained below.

With regard to the transfer of a hole pattern of 0.4 μm to a 1 μm thick positive novolac resist on a wafer by using a 5:1 reduction projection aligner (N. A.=0.5) using the i-line (wavelength: 365 nm), for example, we examined the depth of focus (the out-of-focus allowance for obtaining an opening of 0.4 μm) for a transfer process using an ordinary photomask and for a transfer process using the phase shift photomask of the present invention. As a result, it was revealed that with the ordinary photomask, a depth of focus of only 0.6 μpm was obtained on the wafer, whereas, with the phase shift photomask of the present invention wherein the phase difference for the i-line was 180° and the transmittance for the i-line was 10%, it was possible to obtain a depth of focus of 1.2 μm on the wafer. Thus, it is possible to form a hole of 0.4 μm on a wafer for an actual device having a step of about 1 μm with a reduction projection aligner using the i-line.

With a reduction projection aligner using the g-line (wavelength: 436 nm), it was also possible to improve the depth of focus by using the phase shift photomask of the present invention having a phase difference and transmittance optimized for the g-line in the same way as in the case of the i-line.

With the exposure method using the phase shift photomask of the present invention, the depth of focus is improved, and it becomes possible to prevent occurrence of an exposure failure. Therefore, it is possible to improve the yield in the process of producing semiconductor devices. The exposure method can be effectively used in the process of producing semiconductor devices such as 4M-, 16M-, 64M- and 256M-bit DRAMs, SRAMs, flash memories, ASICs, microcomputers and GaAs devices. It can also satisfactorily be used in the process of producing unit semiconductor devices and liquid crystal display devices.

EXAMPLE 4

The triple-layer structure shown in FIG. 12 is used as a layer configuration of a semitransparent film.

The exposure wavelength is assumed to be 365 nm. Assuming that the substrate 1 is a quartz substrate, the refractive index thereof is 1.475. Assuming that the films 7 and 9 are made of chromium oxide nitride carbide and the film 8 is made of chromium nitride, the refractive indices and extinction coefficients are as follows: in order from the substrate side, $n_0$: 1.475; $n_1$: 2.46; $k_1$: 0.29; $n_2$: 1.94; $k_2$: 3.15; $n_3$: 2.46; $k_3$: 0.29; and $n_4$: 1. It is further assumed that the thicknesses of the films 7, 8 and 9 are $h_1$, $h_2$ and $h_3$, respectively. Assuming that $h_1=70$ nm, $h_2=5$ nm, and $h_3=54.9$ nm, the phase difference $\Phi$ between the region where the triple-layer film is present and a region where no film is present is 171° when the interface phase difference is taken into consideration. In this case, there is no change in the phase difference even if the thickness of the film 8 is changed by $\Delta h_2$, while the thickness of the film 9 is changed by $\Delta h_3$ (it should be noted that $\Delta h_2$ and $\Delta h_3$ both indicate an increase in the film thickness when positive and a reduction in the film thickness when negative) so that the relationship of $(n_2-1)\Delta h_2+(n_3-1)\Delta h_3=0$ is satisfied. FIG. 15 is a graph showing the changes of transmittance when $h_2$ and $h_3$ were changed so as to satisfy the above relationship. The transmittance was calculated from Equation (2) and the optical constant of each of the above-described films.

It will be understood from FIG. 15 that a triple-layer structure such as that shown in FIG. 12 enables the transmittance to be controlled with the phase difference maintained simply by varying the thicknesses of the two films constituting two layers without changing the film quality. Although the films 7 and 9 are formed by using chromium oxide nitride carbide, these films may be formed of other materials. That is, the film 7 may be formed by using one material selected from among chromium oxide, chromium oxide nitride, chromium oxide carbide, and chromium oxide nitride carbide. The film 8 may be formed by using either chromium or chromium nitride. The film 9 may be formed by using one material selected from among chromium oxide, chromium oxide nitride, chromium oxide carbide, and chromium oxide nitride carbide. The films 7 and 9 do not necessarily need to be formed of the same material.

Although in this example the semitransparent film has been explained by using a triple-layer structure as shown in FIG. 12, it should be noted that similar control can be effected by using a double-layer structure such as that shown in FIG. 11.

EXAMPLE 5

The triple-layer structure shown in FIG. 12 is used as a layer configuration of a semitransparent film.

The exposure wavelength is assumed to be 365 nm. Assuming that the substrate 1 is a quartz substrate, the refractive index thereof is 1.475. Assuming that the films 7 and 9 are made of chromium oxide nitride carbide and the film 8 is made of chromium nitride, the refractive indices and extinction coefficients are as follows: in order from the substrate side, $n_0$: 1.475; $n_1$: 2.46; $k_1$: 0.29; $n_2$: 1.94; $k_2$: 3.15; $n_3$: 2.46; $k_3$: 0.29; and $n_4$: 1. It is further assumed that the thicknesses of the films 7, 8 and 9 are $h_1$, $h_2$ and $h_3$, respectively. Assuming that $h_1=8$ nm, $h_2=10$ nm, and $h_3=120$ nm, the phase difference $\Phi$ between the region where the triple-layer film is present and a region where no film is present is 181° when the interface phase difference is taken into consideration. In this case, there is no change in the phase difference even if the thicknesses $h_1$ and $h_3$ of the films 7 and 9 are changed so that the relationship of $h_1+h_3=128$ nm is satisfied. FIG. 16 is a graph showing the changes of the reflectivities of the obverse and reverse surfaces of the mask when $h_1$ and $h_3$ were changed so as to satisfy the above relationship. The reflectivities were calculated from Equation (3) and the optical constant of each of the above-described films.

It will be understood from FIG. 16 that a triple-layer structure such as that shown in FIG. 12 enables the reflectivities of the obverse and reverse surfaces of the mask to be controlled by varying the thicknesses of the two films. Although the films 7 and 9 are formed by using chromium oxide nitride carbide, these films may be formed of other materials. That is, the film 7 may be formed by using one material selected from among chromium oxide, chromium oxide nitride, chromium oxide carbide, and chromium oxide nitride carbide. The film 8 may be formed by using either chromium or chromium nitride. The film 9 may be formed by using one material selected from among chromium oxide, chromium oxide nitride, chromium oxide carbide, and chromium oxide nitride carbide. The films 7 and 9 do not necessarily need to be formed of the same material.

EXAMPLE 6

On an optically polished quartz substrate, a chromium oxide nitride carbide film having a refractive index of 2.50 for the i-line and an extinction coefficient of 0.27 for the i-line is formed to a thickness of 116 nm by carrying out reactive sputtering using a chromium target and a mixed gas of nitrogen and carbon dioxide gas as a sputter gas while controlling the gas flow rate ratio. Next, a chromium nitride film having a refractive index of 1.93 for the i-line and an extinction coefficient of 3.15 for the i-line is formed to a thickness of 10 nm by carrying out reactive sputtering using argon and nitrogen while controlling the gas flow rate ratio. The sheet resistance of the film is 26 ohm/sq. The transmittance for the i-line is 7.0%.

Next, an electron beam resist EBR 900 (manufactured by Toray Industries, Inc.) is spin-coated on the blank and subjected to pre-bake at 110° C., thereby forming a resist layer of 500 nm in thickness.

Next, a predetermined pattern is formed by exposure using an electron beam exposure system MEBESIV (manufactured by Etec Systems Inc.). Since the uppermost layer is formed of chromium nitride, which is electrically conductive, charge-up is prevented during the exposure. Therefore, no displacement of the resist pattern occurs.

Next, the resist layer is developed with a developer containing TMAH (tetramethylammonium hydride) as a principal component, and thereafter rinsed in water, thereby forming a resist pattern.

Next, according to need, heating and descum treatments are carried out to remove resist scum from the resist pattern. Thereafter, portions of the semitransparent film exposed through the openings in the resist pattern, which are to be processed, are subjected to dry etching by an etching plasma using $CH_2Cl_2+O_2$ gas, thereby forming a semitransparent pattern.

After the above etching process, the remaining resist is removed by an oxygen plasma, followed by cleaning, inspection and correction. Thus, a favorable halftone phase shift photomask is completed.

Although in this example the halftone phase shift photomask has been described by using a double-layer structure as shown in FIG. 10, similar control can be effected by using a triple-layer structure such as that shown in FIG. 12.

EXAMPLE 7

The double-layer structure shown in FIG. 11 was used. The film 5 was formed of chromium nitride, while the film 6 was formed of chromium oxide nitride carbide. Two exposure wavelengths were used: $\lambda_i$=365 nm (the i-line), and $\lambda_g$=436 nm (the g-line). The refractive indices and extinction coefficients of the films 5 and 6 for the i-line were as follows: $n_{1i}$=1.94, $k_{1i}$=3.15 $n_{2i}$=2.47 and $k_{2i}$=0.29. On the other hand, the refractive indices and extinction coefficients for the g-line of films 5 and 6, which had the same compositions as those of the above films 5 and 6, were as follows: $n_{1g}$=2.36, $k_{1g}$=3.51, $n_{2g}$=2.38, and $k_{2g}$=0.14.

Accordingly, as a layer configuration for the i-line, films 5 and 6 were formed so that their respective thicknesses were $h_{1i}$=10 nm and $h_{2i}$=125 nm, and as a layer configuration for the g-line, films 5 and 6 were formed so that their respective thicknesses were $h_{1g}$=15 nm and $h_{2g}$=160 nm. Thus, it was possible to produce blanks having a phase difference of about 180° for the i- and g-lines and a transmittance of 6% to 8% for the i- and g-lines.

Let us evaluate the phase difference on the basis of the value of a in Equation (2) for the sake of simplification, although the phase difference should be evaluated on the basis of Equation (1) using the above numerical values. For the i-line, a=0.53; for the g-line, a=0.55. Thus, a is close to ½, and it is therefore confirmed that the selection of film thicknesses is rational.

The double-layer structure in this example has the following advantages:

(1) Blanks for the i-line and the g-line can be produced simply by varying the period of time for film formation without changing the film forming conditions. Accordingly, production stability improves, and the process control is facilitated.

(2) Since there are only several materials to be subjected to characteristic evaluation, the quality assurance is facilitated.

EXAMPLE 8

FIG. 19 is a sectional view schematically showing a halftone phase shift photomask in one example of the present invention. On a transparent substrate 301 of optically polished quartz glass, a first semitransparent film 302 is formed to a thickness of 70 nm by PVD using a chromium compound composed of chromium, oxygen and nitrogen, and a second semitransparent film 303 is stacked thereon to a thickness of 65 nm by a similar method using a chromium compound composed of chromium, oxygen, nitrogen and carbon. The first and second transparent films 302 and 303 are patterned to constitute a semitransparent layer pattern 304. It should be noted that the refractive indices of the first and second semitransparent films 302 and 303 for 356 nm were 2.3 and 2.4, respectively. It was possible to adjust the refractive index of each film by about 20% by controlling the film forming conditions.

FIG. 20 is a graph showing one example of the spectral transmittance in the wavelength range of from 200 nm to 800 nm in the region of the semitransparent layer 304 of the halftone phase shift photomask in this example. The transmittance at 365 nm has been adjusted to 11.5%, which falls within the range of from 3% to 35%. It was possible to adjust the transmittance of each layer by controlling the film forming conditions and the film thickness.

When an etched portion of the semitransparent layer 304, composed of two layers, on the transparent substrate 301 formed in this example was obliquely observed from above it with a scanning electron microscope (SEM), it was revealed that the end face of the semitransparent layer was divided into two portions and the end portions had been adjusted so as to align perpendicularly to the substrate surface.

FIGS. 21(a) to 21(c) are sectional views showing the process sequence for producing the halftone phase shift photomask in this example. First, as shown in FIG. 21(a), on a transparent substrate 301 of optically polished quartz glass, a first semitransparent film 302 was formed to a thickness of 70 nm by sputtering using a chromium target and a mixed gas of argon, oxygen and nitrogen, and a second semitransparent film 303 was stacked thereon to a thickness of 65 nm by sputtering using a mixed gas of argon, oxygen, nitrogen, and carbon dioxide, thereby completing a halftone phase shift photomask blank having a semitransparent layer 304 formed from the double-layer film.

The refractive indices of the first and second semitransparent films 302 and 303 for the wavelength of 365 nm were 2.3 and 2.4, respectively. The transmittance in the wavelength range of from 200 nm to 800 nm was similar to that shown in FIG. 20.

Next, as shown in FIG. 21(b), a desired resist pattern 306 of a material containing an organic substance as a principal component was formed on the semitransparent layer 304 by using the conventional electron beam lithography or photolithography.

Next, as shown in FIG. 21(c), the semitransparent layer 304 exposed through the openings in the resist pattern 306 was continuously etched by dry etching using a mixed gas prepared by adding oxygen to $Cl_2$, $CCl_4$, $CHCl_3$, $CH_2Cl_2$, etc., thereby forming a desired opening pattern 305. Finally, the remaining resist 306 was removed by plasma ashing or wet releasing process, thus completing one example of the halftone phase shift photomask according to the present invention as shown in FIG. 19.

EXAMPLE 9

FIG. 22 is a sectional view of another example of the halftone phase shift photomask blank. In this example, on a transparent substrate 301 of optically polished quartz glass, a first semitransparent film 307 of a chromium compound composed of chromium, oxygen, nitrogen and carbon was formed to a thickness of 70 nm to 90 nm by sputtering similar to that in Example 8, and subjected to vacuum heat treatment for about 10 minutes to 30 minutes at a temperature of 200° C. to 400° C. to improve the film texture and the film surface. Thereafter, a second semitransparent film 308 of a chromium compound was formed to a thickness of 40 nm to 70 nm on the first semitransparent film 307 by a method similar to that used to form the first semitransparent film 307, thereby forming a semitransparent film 309. Thus, a halftone phase shift photomask blank of Example 9 of the present invention was completed.

In this example, since the second semitransparent film 308 is formed after the surface of the first semitransparent film 307 has been modified, the columnar texture is finer than in the case of a semitransparent layer formed from a single layer at a time. For this reason, the halftone phase shift photomask blank of Example 9 having the semitransparent layer 309 formed from the double-layer film was superior in the etching accuracy.

Although in Example 9 a chromium compound composed of chromium, oxygen, nitrogen and carbon was used, it is also possible to use a chromium compound composed of chromium and oxygen, or chromium, oxygen and nitrogen, or chromium, oxygen and carbon, as a matter of course.

As will be clear from the foregoing description, the halftone phase shift photomask and halftone phase shift photomask blank according to the first aspect of the present invention are simple in structure and enable the photoengraving process to be shortened. Therefore, it is possible not only to achieve a reduction in cost and an improvement in yield but also to use the greater part of a production line for conventional chromium masks as it is. Accordingly, the halftone phase shift photomask and halftone phase shift photomask blank can be put to practical use extremely easily.

The halftone phase shift photomask and halftone phase shift photomask blank according to the second aspect of the present invention can be produced by using the same production process, the same inspection process and the same correction process as those for ordinary photomasks. Accordingly, halftone phase shift photomasks, which have heretofore been suffering from a low yield and a high cost due to an increase in the number of manufacturing steps and incapability of correcting defects, can be produced at approximately the same cost as that of ordinary photomasks. In addition, it is possible to prevent charge-up during electron beam exposure. Further, it becomes possible to control the transmittance and reflectivity by combination of film thicknesses. In addition, an optimal multilayer structure can be realized for each of at least two different kinds of exposure light by controlling the thickness of each layer with the film composition of each layer maintained as it is.

In the halftone phase shift photomask and halftone phase shift photomask blank according to the third aspect of the present invention, the semitransparent layer of the halftone phase shift photomask is made of a chromium compound which is formed by physical vapor deposition. Accordingly, a physical cleaning process, e.g., brush cleaning, high-pressure water cleaning, ultrasonic cleaning, etc., which has heretofore been used for cleaning photomasks, can be used therefor as it is. It is therefore possible to produce a clean halftone phase shift photomask having quality equal or close to that of ordinary photomasks and also possible to obtain a clean halftone phase shift photomask blank. In addition, since the semitransparent layer of the halftone phase shift photomask has a thickness not larger than a half of the thickness of the conventional semitransparent layer formed by using coating glass, it is possible to produce a highly accurate halftone phase shift photomask having even more vertical processed sections.

What we claim is:

1. A halftone phase shift photomask having on a transparent substrate a halftone phase shift layer which includes at least one layer composed mainly of a chromium compound, wherein the ratio of the number of chromium atoms to the number of oxygen atoms in said layer composed mainly of a chromium compound, when measured by X-ray photoelectron spectroscopy, falls within the range of from 100:100 to 100:300.

2. A halftone phase shift photomask according to claim 1, wherein said at least one layer composed mainly of a chromium compound contains a number of carbon atoms which is not smaller than 2% of the number of chromium atoms.

3. A halftone phase shift photomask according to claim 2, wherein a larger number of carbon atoms are contained in a surface region within the depth of 3 nm from the surface of said at least one layer composed mainly of a chromium compound than in the other region.

4. A halftone phase shift photomask according to claim 1, wherein said at least one layer composed mainly of a chromium compound contains nitrogen atoms in such a proportion that the total number of nitrogen and oxygen atoms is not larger than 350 per 100 chromium atoms.

5. A halftone phase shift photomask according to claim 1, wherein said at least one layer composed mainly of a chromium compound contains argon atoms in such a proportion that the total number of argon and oxygen atoms is not larger than 350 per 100 chromium atoms.

6. A halftone phase shift photomask according to any of claims 1 to 5, wherein said at least one layer composed mainly of a chromium compound contains impurity atoms other than chromium, oxygen, carbon, nitrogen and argon atoms within the range in which the refractive index for a wavelength of exposure light that is obtained by ellipsometry will not be changed by 0.1 or more.

7. A halftone phase shift photomask according to any of claims 1 to 6, wherein said halftone phase shift layer is formed on said transparent substrate so that the phase difference $\phi$, which is obtained by the following equation, is $n\pi \pm \pi/3$ radians (n is an odd integer):

$$\phi = \sum_{k=1}^{m-1} x^{k,k+1} + \sum_{k=2}^{m-1} 2(u_k - 1)d_k/\lambda$$

where $\phi$ is the phase change of the light perpendicularly passing through the photomask having a multilayer (m−2 layers) film formed on said substrate, $x^{k,k+1}$ is the phase change occurring at the interface between the k-th layer and the (k+1)th layer, $u_k$ and $d_k$ are the refractive index of a material constituting the k-th layer and the thickness of the k-th layer, respectively, and $\lambda$ is the wavelength of exposure light, and where the layer of k=1 is assumed to be said transparent substrate, and the layer of k=m is assumed to be air.

8. A halftone phase shift photomask according to any of claims 1 to 7, wherein said halftone phase shift layer is formed on said transparent substrate at such a thickness that the transmittance for exposure light is in the range of from 1% to 50%.

9. A halftone phase shift photomask blank having on a transparent substrate a halftone phase shift layer which includes at least one layer composed mainly of a chromium compound, wherein the ratio of the number of chromium atoms to the number of oxygen atoms in said layer composed mainly of a chromium compound, when measured by X-ray photoelectron spectroscopy, falls within the range of from 100:100 to 100:300.

10. A halftone phase shift photomask blank according to claim 9, wherein said at least one layer composed mainly of a chromium compound contains a number of carbon atoms which is not smaller than 2% of the number of chromium atoms.

11. A halftone phase shift photomask blank according to claim 10, wherein a larger number of carbon atoms are contained in a surface region within the depth of 3 nm from the surface of said at least one layer composed mainly of a chromium compound than in the other region.

12. A halftone phase shift photomask blank according to claim 9, wherein said at least one layer composed mainly of a chromium compound contains nitrogen atoms in such a proportion that the total number of nitrogen and oxygen atoms is not larger than 350 per 100 chromium atoms.

13. A halftone phase shift photomask blank according to claim 9, wherein said at least one layer composed mainly of a chromium compound contains argon atoms in such a proportion that the total number of argon and oxygen atoms is not larger than 350 per 100 chromium atoms.

14. A halftone phase shift photomask blank according to any of claims 9 to 13, wherein said at least one layer composed mainly of a chromium compound contains impurity atoms other than chromium, oxygen, carbon, nitrogen and argon atoms within the range in which the refractive index for a wavelength of exposure light that is obtained by ellipsometry will not be changed by 0.1 or more.

15. A halftone phase shift photomask blank according to any of claims 9 to 14, wherein said halftone phase shift layer is formed on said transparent substrate so that the phase difference $\phi$, which is obtained by the following equation, is $n\pi \pm \pi/3$ radians (n is an odd integer):

$$\phi = \sum_{k=1}^{m-1} x^{k,k+1} + \sum_{k=2}^{m-1} 2\pi(u_k - 1)d_k/\lambda$$

where $\phi$ is the phase change of the light perpendicularly passing through the photomask having a multilayer (m–2 layers) film formed on said substrate, $x^{k,k+1}$ is the phase change occurring at the interface between the k-th layer and the (k+1)th layer, $u_k$ and $d_k$ are the refractive index of a material constituting the k-th layer and the thickness of the k-th layer, respectively, and $\lambda$ is the wavelength of exposure light, and where the layer of k=1 is assumed to be said transparent substrate, and the layer of k=m is assumed to be air.

16. A halftone phase shift photomask blank according to any of claims 9 to 15, wherein said halftone phase shift layer is formed on said transparent substrate at such a thickness that the transmittance for exposure light is in the range of from 1% to 50%.

17. A halftone phase shift photomask having on a transparent substrate a region which is semitransparent to exposure light and a region which is transparent to the exposure light so that the phase difference between light passing through said transparent region and light passing through said semitransparent region is substantially $\pi$ radians, wherein said semitransparent region is formed from a multilayer semitransparent film of chromium or a chromium compound.

18. A halftone phase shift photomask according to claim 17, wherein said semitransparent film is arranged in the form of a double-layer film which includes, in order from the transparent substrate side, a single-layer film of a compound selected from among chromium oxide, chromium oxide nitride, chromium oxide carbide, and chromium oxide nitride carbide, and a single-layer film of either chromium or chromium nitride.

19. A halftone phase shift photomask according to claim 17, wherein said semitransparent film is arranged in the form of a double-layer film which includes, in order from the transparent substrate side, a single-layer film of either chromium or chromium nitride, and a single-layer film of a compound selected from among chromium oxide, chromium oxide nitride, chromium oxide carbide, and chromium oxide nitride carbide.

20. A halftone phase shift photomask according to claim 17, wherein said semitransparent film is arranged in the form of a triple-layer film which includes, in order from the transparent substrate side, a single-layer film of a compound selected from among chromium oxide, chromium oxide nitride, chromium oxide carbide, and chromium oxide nitride carbide, a single-layer film of either chromium or chromium nitride, and a single-layer film of a compound selected from among chromium oxide, chromium oxide nitride, chromium oxide carbide, and chromium oxide nitride carbide.

21. A halftone phase shift photomask according to claim 17, wherein said semitransparent film is arranged in the form of a double-layer film which includes, in order from the transparent substrate side, a single-layer film of an electrically conductive chromium compound, and a single-layer film of a compound selected from among chromium oxide, chromium oxide nitride, chromium oxide carbide, and chromium oxide nitride carbide.

22. A halftone phase shift photomask according to claim 17, wherein said semitransparent film is arranged in the form of a double-layer film which includes, in order from the transparent substrate side, a single-layer film of a compound selected from among chromium oxide, chromium oxide nitride, chromium oxide carbide, and chromium oxide nitride carbide, and a single-layer film of an electrically conductive chromium compound.

23. A halftone phase shift photomask according to claim 17, wherein said semitransparent film is arranged in the form of a triple-layer film which includes, in order from the transparent substrate side, a single-layer film of a compound selected from among chromium oxide, chromium oxide nitride, chromium oxide carbide, and chromium oxide nitride carbide, a single-layer film of an electrically conductive chromium compound, and a single-layer film of a compound selected from among chromium oxide, chromium oxide nitride, chromium oxide carbide, and chromium oxide nitride carbide.

24. A halftone phase shift photomask according to any of claims 17 to 23, wherein said semitransparent region is formed on said transparent substrate so that the phase difference $\Phi$ between said semitransparent region and said transparent region, which is obtained by the following equation, falls within the range of $n\pi \pm \pi/3$ radians (n is an odd integer):

$$\Phi = \sum_{k=2}^{m-1} 2\pi(n_k - 1)d_k/\lambda$$

where $\Phi$ is the phase difference of the light perpendicularly passing through the photomask having a multilayer (m–2 layers) film formed on said transparent substrate, $n_k$, $d_k$ are the refractive index and thickness, respectively, of a material constituting the k-th layer, and $\lambda$ is the wavelength of exposure light, and where the layer of k=1 is assumed to be said transparent substrate, and the layer of k=m (m>3; m is an integer) is assumed to be air.

25. A halftone phase shift photomask according to any of claims 17 to 24, wherein said semitransparent region is formed so that its transmittance for exposure light is in the range of from 1% to 50%.

26. A method of producing a halftone phase shift photomask having on a transparent substrate a region which is semitransparent to exposure light and a region which is transparent to the exposure light so that the phase difference between light passing through said transparent region and light passing through said semitransparent region is substantially $\pi$ radians, said semitransparent region being formed from a triple-layer transparent film which includes, in order from the transparent substrate side, a single-layer film of a compound selected from among chromium oxide, chromium oxide nitride, chromium oxide carbide, and chromium oxide nitride carbide, a single-layer film of an electrically conductive chromium compound, and a single-layer film of a compound selected from among chromium oxide, chromium oxide nitride, chromium oxide carbide, and chromium oxide nitride carbide, wherein a transmittance of said semitransparent region is controlled by varying the thickness of either or each of said first and third single-layer films, which are made of a compound selected from among chromium oxide, chromium oxide nitride, chromium oxide carbide, and chromium oxide nitride carbide, and the thickness of said single-layer film of an electrically conductive chromium compound.

27. A method of producing a halftone phase shift photomask having on a transparent substrate a region which is semitransparent to exposure light and a region which is transparent to the exposure light so that the phase difference between light passing through said transparent region and light passing through said semitransparent region is substantially π radians, said semitransparent region being formed from a triple-layer transparent film which includes, in order from the transparent substrate side, a single-layer film of a compound selected from among chromium oxide, chromium oxide nitride, chromium oxide carbide, and chromium oxide nitride carbide, a single-layer film of an electrically conductive chromium compound, and a single-layer film of a compound selected from among chromium oxide, chromium oxide nitride, chromium oxide carbide, and chromium oxide nitride carbide, wherein a reflectivity of the obverse or reverse surface of said mask is controlled by varying the thickness ratio between said first and third single-layer films, which are made of a compound selected from among chromium oxide, chromium oxide nitride, chromium oxide carbide, and chromium oxide nitride carbide.

28. A halftone phase shift photomask blank having on a transparent substrate a region which is semitransparent to exposure light and a region which is transparent to the exposure light so that the phase difference between light passing through said transparent region and light passing through said semitransparent region is substantially π radians, wherein said semitransparent region is formed from a multilayer semitransparent film of chromium or a chromium compound.

29. A halftone phase shift photomask blank according to claim 28, wherein said semitransparent film is arranged in the form of a double-layer film which includes, in order from the transparent substrate side, a single-layer film of a compound selected from among chromium oxide, chromium oxide nitride, chromium oxide carbide, and chromium oxide nitride carbide, and a single-layer film of either chromium or chromium nitride.

30. A halftone phase shift photomask blank according to claim 28, wherein said semitransparent film is arranged in the form of a double-layer film which includes, in order from the transparent substrate side, a single-layer film of either chromium or chromium nitride, and a single-layer film of a compound selected from among chromium oxide, chromium oxide nitride, chromium oxide carbide, and chromium oxide nitride carbide.

31. A halftone phase shift photomask blank according to claim 28, wherein said semitransparent film is arranged in the form of a triple-layer film which includes, in order from the transparent substrate side, a single-layer film of a compound selected from among chromium oxide, chromium oxide nitride, chromium oxide carbide, and chromium oxide nitride carbide, a single-layer film of either chromium or chromium nitride, and a single-layer film of a compound selected from among chromium oxide, chromium oxide nitride, chromium oxide carbide, and chromium oxide nitride carbide.

32. A halftone phase shift photomask blank according to claim 28, wherein said semitransparent film is arranged in the form of a double-layer film which includes, in order from the transparent substrate side, a single-layer film of an electrically conductive chromium compound, and a single-layer film of a compound selected from among chromium oxide, chromium oxide nitride, chromium oxide carbide, and chromium oxide nitride carbide.

33. A halftone phase shift photomask blank according to claim 28, wherein said semitransparent film is arranged in the form of a double-layer film which includes, in order from the transparent substrate side, a single-layer film of a compound selected from among chromium oxide, chromium oxide nitride, chromium oxide carbide, and chromium oxide nitride carbide, and a single-layer film of an electrically conductive chromium compound.

34. A halftone phase shift photomask blank according to claim 28, wherein said semitransparent film is arranged in the form of a triple-layer film which includes, in order from the transparent substrate side, a single-layer film of a compound selected from among chromium oxide, chromium oxide nitride, chromium oxide carbide, and chromium oxide nitride carbide, a single-layer film of an electrically conductive chromium compound, and a single-layer film of a compound selected from among chromium oxide, chromium oxide nitride, chromium oxide carbide, and chromium oxide nitride carbide.

35. A halftone phase shift photomask blank according to any of claims 28 to 34, wherein said semitransparent region is formed on said transparent substrate so that the phase difference Φ between said semitransparent region and said transparent region, which is obtained by the following equation, falls within the range of $n\pi \pm \pi/3$ radians (n is an odd integer):

$$\Phi = \sum_{k=2}^{m-1} 2\pi(n_k - 1)d_k/\lambda$$

where Φ is the phase difference of light perpendicularly passing through the photomask having a multilayer (m−2 layers) film formed on said transparent substrate, $n_k$, $d_k$ are the refractive index and thickness, respectively, of a material constituting the k-th layer, and λ is the wavelength of exposure light, and where the layer of k=1 is assumed to be said transparent substrate, and the layer of k=m (m>3; m is an integer) is assumed to be air.

36. A halftone phase shift photomask blank according to any of claims 28 to 35, wherein said semitransparent region is formed so that its transmittance for exposure light is in the range of from 1% to 50%.

37. A method of producing a blank used to produce a halftone phase shift photomask having on a transparent substrate a region which is semitransparent to exposure light and a region which is transparent to the exposure light so that the phase difference between light passing through said transparent region and light passing through said semitransparent region is substantially π radians, said semitransparent region being formed from a triple-layer transparent film which includes, in order from the transparent substrate side, a single-layer film of a compound selected from among chromium oxide, chromium oxide nitride, chromium oxide carbide, and chromium oxide nitride carbide, a single-layer film of an electrically conductive chromium compound, and a single-layer film of a compound selected from among chromium oxide, chromium oxide nitride, chromium oxide carbide, and chromium oxide nitride carbide, wherein a transmittance of said semitransparent region is controlled by varying the thickness of either or each of said first and third single-layer films, which are made of a compound selected from among chromium oxide, chromium oxide nitride, chromium oxide carbide, and chromium oxide nitride carbide, and the thickness of said single-layer film of an electrically conductive chromium compound.

38. A method of producing a blank used to produce a halftone phase shift photomask having on a transparent substrate a region which is semitransparent to exposure light and a region which is transparent to the exposure light so that the phase difference between light passing through said transparent region and light passing through said semitransparent region is substantially π radians, said semitransparent region being formed from a triple-layer transparent film which includes, in order from the transparent substrate side, a single-layer film of a compound selected from among chromium oxide, chromium oxide nitride, chromium oxide carbide, and chromium oxide nitride carbide, a single-layer film of an electrically conductive chromium compound, and a single-layer film of a compound selected from among chromium oxide, chromium oxide nitride, chromium oxide carbide, and chromium oxide nitride carbide, wherein a reflectivity of the obverse or reverse surface of said mask is controlled by varying the thickness ratio between said first and third single-layer films, which are made of a compound selected from among chromium oxide, chromium oxide nitride, chromium oxide carbide, and chromium oxide nitride carbide.

39. A halftone phase shift photomask having on a transparent substrate a transparent region and a semitransparent region which is defined by a semitransparent layer of a chromium compound formed by physical vapor deposition, wherein when the transmittance of said transparent region for a wavelength of exposure light applied during transfer is assumed to be 100%, the transmittance of said semitransparent region falls within the range of from 3% to 35%, and said semitransparent region shifts the phase of the exposure wavelength through substantially π radians with respect to said transparent region.

40. A halftone phase shift photomask according to claim 39, wherein said chromium compound consists essentially of chromium and oxygen, or chromium, oxygen and nitrogen, or chromium, oxygen and carbon, or chromium, oxygen, nitrogen and carbon, and said semitransparent layer is formed from a single-layer film or a multilayer film including two or more layers.

41. A halftone phase shift photomask blank having on a transparent substrate a semitransparent layer of a chromium compound formed by physical vapor deposition, wherein when the transmittance of said transparent substrate for a wavelength of exposure light applied during transfer is assumed to be 100%, the transmittance of said semitransparent layer falls within the range of from 3% to 35%, and said semitransparent layer shifts the phase of the exposure wavelength through substantially π radians.

42. A halftone phase shift photomask blank according to claim 41, wherein said chromium compound consists essentially of chromium and oxygen, or chromium, oxygen and nitrogen, or chromium, oxygen and carbon, or chromium, oxygen, nitrogen and carbon, and said semitransparent layer is formed from a single-layer film or a multilayer film including two or more layers.

* * * * *